(12) United States Patent
Kochi et al.

(10) Patent No.: US 6,510,193 B1
(45) Date of Patent: *Jan. 21, 2003

(54) CHARGE TRANSFER DEVICE AND A SEMICONDUCTOR CIRCUIT INCLUDING THE DEVICE

(75) Inventors: Tetsunobu Kochi, Hiratsuka (JP); Mamoru Miyawaki, Isehara (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/739,786

(22) Filed: Oct. 30, 1996

(30) Foreign Application Priority Data

Oct. 30, 1995 (JP) ............................................. 7-281657

(51) Int. Cl.[7] .................... G11C 19/28; H01L 29/768
(52) U.S. Cl. .................... 377/60; 257/236; 257/239; 257/241
(58) Field of Search .................... 257/236, 239–241; 377/60

(56) References Cited

U.S. PATENT DOCUMENTS

| | | | | |
|---|---|---|---|---|
| 3,623,132 A | * | 11/1971 | Green | 257/239 |
| 3,806,772 A | * | 4/1974 | Early | 257/239 |
| 3,986,180 A | | 10/1976 | Cade | 340/173 |
| 4,032,767 A | * | 6/1977 | Lagnado | 257/236 |
| 4,145,676 A | * | 3/1979 | Benoit-Gonin et al. | 257/241 |
| 4,195,282 A | | 3/1980 | Cameron | 340/347 |

(List continued on next page.)

FOREIGN PATENT DOCUMENTS

| | | |
|---|---|---|
| DE | 4402952 A1 | 6/1994 |
| EP | 0226338 | 6/1987 |
| EP | 0260858 | 3/1988 |
| EP | 0444938 A2 | 9/1991 |
| EP | 0489724 A2 | 6/1992 |
| EP | 0522732 A2 | 1/1993 |
| EP | 0540163 A2 | 5/1993 |
| EP | 0569856 A2 | 11/1993 |
| FR | 2536922 | 6/1984 |
| FR | 2599526 | 12/1987 |
| JP | 62-023152 | 1/1987 |
| JP | 01-081082 | 3/1989 |

OTHER PUBLICATIONS

R.M. Chittenden and N.R. Plummer, "Sampling Control for Analog Waveform Analyzer", IBM Tech. Discl. Bull. vol. 9 No. 6, pp. 603–603, Nov. 1966.

M. Yamashina, "A Microprogrammable Real–Time Video Signal Processor (VSP) for Motion Compensation", Journel of Solid–State Circuits, vol. 23, No. 5, pp. 905–917, Aug. 1988.

(List continued on next page.)

Primary Examiner—Gene M. Munson
(74) Attorney, Agent, or Firm—Fitzpatrick, Cella, Harper & Scinto

(57) ABSTRACT

By providing a semiconductor device including a charge transfer channel to one end of which electric charges supplied from a charge supply unit are input, and which includes a plurality of branching regions at an intermediate portion, a plurality of gate electrodes provided on the corresponding branching regions of the charge transfer channel via insulating films, an input-signal supply unit for supplying each of the gate electrodes with an input signal, a transfer electrode, provided on the charge transfer channel via a gate insulating film, for performing control so that the electric charges are transferred in a predetermined direction within the charge transfer channel, a conversion unit for coverting the transferred electric charges into a voltage, and a sense amplifier to which an output signal from the conversion unit is input, and by providing a semiconductor circuit which includes such a device, it is possible to reduce the scale of circuitry, increase the calculation speed, and reduce electric power consumption.

10 Claims, 19 Drawing Sheets

U.S. PATENT DOCUMENTS

| | | | |
|---|---|---|---|
| 4,255,715 A | | 3/1981 | Cooperman .................... 330/9 |
| 4,270,144 A | * | 5/1981 | Hartman et al. ............ 257/241 |
| 4,382,187 A | | 5/1983 | Farleux et al. .............. 250/578 |
| 4,421,996 A | | 12/1983 | Chuang et al. ............. 307/530 |
| 4,446,438 A | | 5/1984 | Chang et al. ............... 328/127 |
| 4,584,568 A | | 4/1986 | Zomorrodi .................. 340/347 |
| 4,588,905 A | | 5/1986 | Kojima ....................... 307/269 |
| 4,597,012 A | | 6/1986 | Itoh et al. ................... 358/213 |
| 4,829,382 A | | 5/1989 | Hess et al. .................. 358/228 |
| 4,870,266 A | | 9/1989 | Ishizaki et al. ............. 250/214 |
| 4,872,010 A | | 10/1989 | Larson et al. ............... 341/134 |
| 4,879,470 A | | 11/1989 | Sugawa et al. ............. 250/578 |
| 5,008,674 A | | 4/1991 | Da Franca et al. ......... 341/150 |
| 5,144,447 A | | 9/1992 | Akimoto et al. ............ 358/213 |
| 5,162,912 A | | 11/1992 | Ueno et al. .................. 358/213 |
| 5,184,006 A | | 2/1993 | Ueno .......................... 250/208 |
| 5,210,434 A | | 5/1993 | Ohmi et al. ................. 257/291 |
| RE34,309 E | | 7/1993 | Tanaka et al. .............. 358/213 |
| 5,262,870 A | | 11/1993 | Nakamura .................. 358/212 |
| 5,262,871 A | | 11/1993 | Wilder et al. ............... 358/213 |
| 5,287,108 A | | 2/1994 | Mayes et al. ................ 341/156 |
| 5,288,988 A | | 2/1994 | Hashimoto et al. ......... 250/208 |
| 5,331,222 A | | 7/1994 | Lin et al. ..................... 307/520 |
| 5,337,270 A | | 8/1994 | Kawata et al. .............. 365/149 |
| 5,341,050 A | | 8/1994 | Mellissinos et al. ........ 307/490 |
| 5,408,422 A | | 4/1995 | Takatori et al. ............. 364/606 |
| 5,420,806 A | | 5/1995 | Shou et al. .................. 364/606 |
| 5,420,807 A | | 5/1995 | Shou et al. .................. 364/606 |
| 5,428,237 A | | 6/1995 | Yuzurihara et al. ......... 257/349 |
| 5,466,961 A | | 11/1995 | Kikuchi et al. ............. 257/379 |
| 5,471,087 A | | 11/1995 | Buerger, Jr. ................. 257/532 |
| 5,539,196 A | | 7/1996 | Miyawaki et al. ....... 250/208.1 |
| 5,565,809 A | | 10/1996 | Shou et al. .................. 327/356 |
| 5,693,932 A | | 12/1997 | Ueno et al. .................. 250/208 |
| 5,714,752 A | | 2/1998 | Ueno et al. .................. 250/208 |
| 5,835,045 A | | 11/1998 | Ogawa et al. .............. 341/155 |
| 5,841,685 A | | 11/1998 | Kochi ......................... 364/807 |
| 5,864,495 A | | 1/1999 | Sakashita et al. ........... 364/807 |
| 5,926,057 A | | 7/1999 | Ogawa et al. .............. 327/359 |

OTHER PUBLICATIONS

Roubik Gregorian and Gabor c. Temes, "Analog MOS Integrated Circuits for Signal Processing", p. 413, published by John Wiley & Sons, Oct. 1998.

Brian C. Martin, "Tips for Staddling the 3–V to 5–V Fence", Electronic Design, 42(1994) Apr. 4, No. 7, pp. 67–68, 70–73.

Nikkei Business Article, pp. 55–57, Mar. 21, 1994.

"An economic Majority logic circuit has been realized using a CMOS structure", Nikkei Electronics, Nov. 5, 1973, pp. 132–144.

* cited by examiner

CROSS SECTION B-B'

CROSS SECTION C-C'

TIME

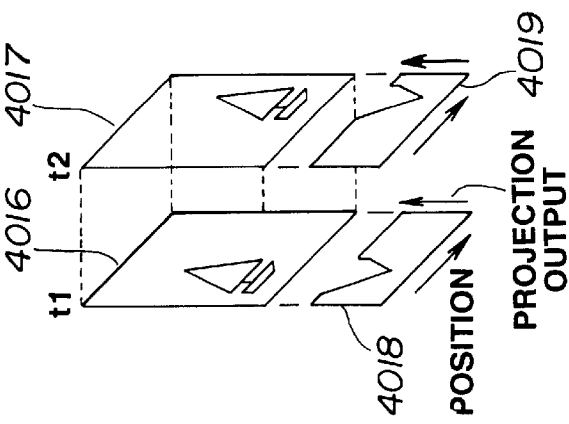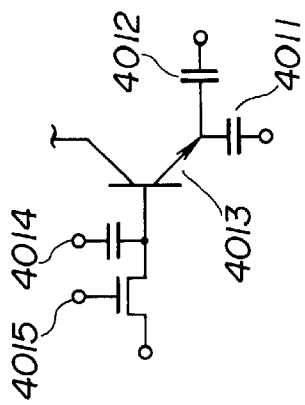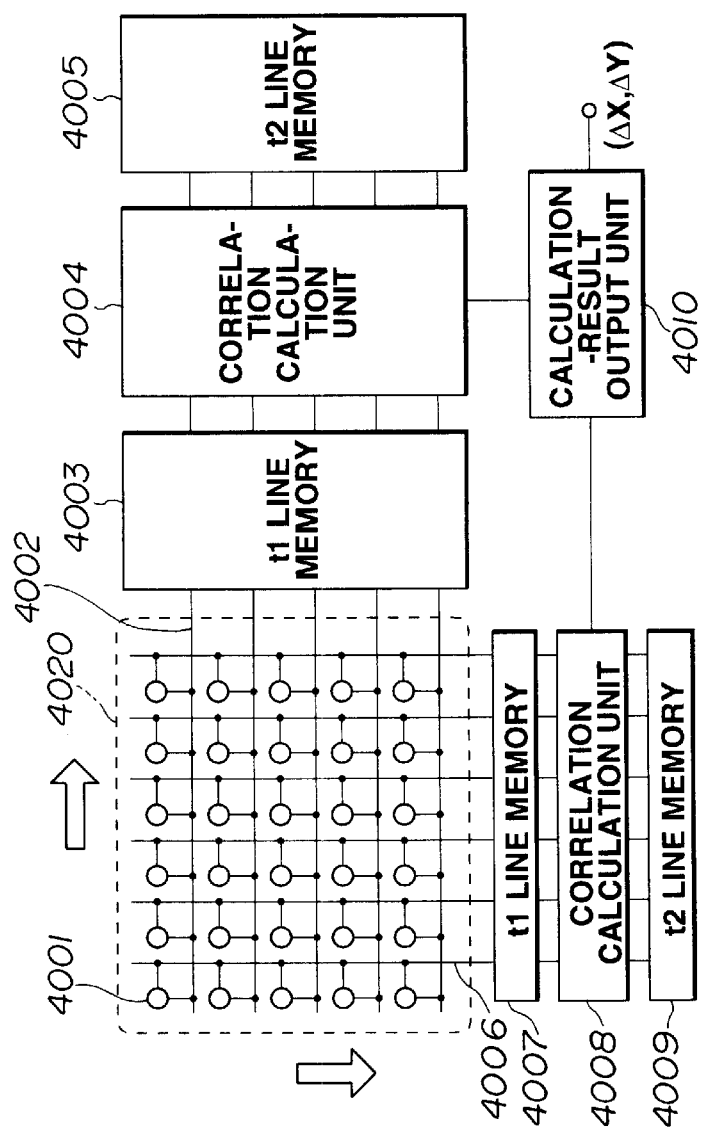

CHARGE TRANSFER DEVICE AND A SEMICONDUCTOR CIRCUIT INCLUDING THE DEVICE

BACKGROUND OF THE INVENTION

1. Field of the Invention

This invention relates to a semiconductor device for performing parallel signal processing, and more particularly, to a semiconductor device for performing calculation processing of multiple input signals by controlling the flow of electric charges from a charge supply unit, and to a semiconductor circuit using such a device.

2. Description of the Related Art

In conventional semiconductor devices for performing parallel calculation processing, as the number of signals to be subjected to parallel calculation increases, the scale of circuitry increases in geometrical progression, so that the production cost increases and the production yield decreases. In accordance with an increase in the scale of circuitry, the calculation speed decreases due to an increase in delay in interconnection and the like, and an increase in the number of calculation operations within the circuitry. In addition, electric power consumption greatly increases.

For example, in the case of a solid-state image pickup device shown in FIG. 1, image pickup elements 41 are arranged along the vertical and horizontal axes. A time-serial analog signal from a sensing unit 60, serving as an area sensor, is converted into a digital signal by an A/D (analog-to-digital) converter 40, and the obtained digital signal is temporarily stored in a frame memory 39. The signal is then processed by a calculation circuit 38, and the resultant signal is output from a calculation-result output circuit 50. More specifically, for example, the amount of movement ($\Delta x$, $\Delta y$) of an object can be output by calculating correlation between data at different times.

However, when intending to perform real-time processing of a moving image, since the number of the above-described calculation processes is extremely large, the scale of circuitry increases in geometrical progression in order to obtain a more real image, thereby reducing the processing speed. For example, apparatuses which can actually deal with the MPEG 2 (Moving Picture Experts Group Phase 2) method proposed as a method for compressing/expanding a moving image are still in a stage of development. Accordingly, the above-described parallel calculation processing has the problems that the calculation speed decreases and electric power consumption increases due to an increase in the scale of circuitry, thereby causing an increase in the production cost and a decrease in the production yield.

A majority calculation circuit which is useful for the above-described calculation processing is described in "An Economic Majority Logic Circuit Has Been Realized Using a CMOS Structure", Nikkei Electronics, Nov. 5, 1973, pp. 132–144 (in Japanese). In this article, a majority logic circuit formed using a CMOS (complementary metal oxide semiconductor) structure is disclosed as a circuit for performing digital signal processing. Even in this case, however, since the number of elements using the CMOS structure increases and the number of steps of calculation processing increases, the above-described problems that the scale of circuitry increases, electric power consumption increases, and the calculation speed decreases remain.

SUMMARY OF THE INVENTION

The present invention has been made in consideration of the above-described problems.

It is an object of the present invention to provide a semiconductor device which can reduce the scale of circuitry, increase the calculation speed and reduce electric power consumption, and to provide a semiconductor circuit which uses such a device.

It is another object of the present invention to provide a semiconductor device which can perform calculation processing, such as majority determination or the like, and improve accuracy in calculation by a configuration using simple manufacturing processes, and to provide a semiconductor circuit which uses such a device.

It is still another object of the present invention to provide a semiconductor device which can perform parallel calculation processing for electric charges, and to provide a semiconductor circuit which uses such a device.

According to one aspect, the present invention which achieves these objectives relates to a semiconductor device comprising a charge transfer channel to one end of which electric charges supplied from charge supply means are input, and which includes a plurality of branching regions at an intermediate portion, a plurality of gate electrodes provided on the corresponding branching regions of the charge transfer channel via insulating films, input-signal supply means for supplying each of the gate electrodes with an input signal, a transfer electrode, provided on the charge transfer channel via a gate insulating film, for performing control so that the electric charges are transferred in a predetermined direction within the charge transfer channel, conversion means for converting the transferred electric charges into a voltage, and sense amplifier means to which an output signal from the conversion means is input, and to a semiconductor circuit which includes such a device.

According to another aspect, the present invention which achieves these objectives relates to a semiconductor device comprising a charge transfer channel to which electric charges are supplied from charge supply means and which includes a plurality of branching regions, a plurality of gate electrodes provided on the corresponding branching regions via insulating films, input-signal supply means for supplying each of the gate electrodes with an input signal, a transfer electrode, adjacent to the gate electrodes, for transferring electric charges in a predetermined direction within the charge transfer channel, and conversion means for coverting the electric charges transferred by the transfer electode into a voltage, and to a semiconductor circuit which includes such a device.

According to the present invention having above-described configurations, for example, the scale of circuitry can be reduced, the calculation speed can be increased, accuracy in calculation can be improved, and electric power consumption can be reduced.

A semiconductor circuit, such as a majority calculation circuit, a correlation calculation circuit or the like, including the semiconductor device of the present invention can reduce the capacity of a memory, and can, for example, further reduce the scale of circuitry, increase the calculation speed, improve accuracy in calculation, and reduce electric power consumption, by performing simpler calculation.

The foregoing and other objects, advantages and features of the present invention will become more apparent from the following description of the preferred embodiments taken in conjuction with the accompanying drawings.

BRIEF DESCRIPTION OF THE DRAWINGS

FIG. 17(A) is a schematic diagram illustrating the entire configuration of a combination of a semiconductor device of the invention with a photosensor, according to a ninth embodiment of the present invention;

FIG. 17(B) is a schematic circuit diagram illustrating a pixel unit of the sensor shown in FIG. 17(A);

FIG. 17(C) is a schematic diagram illustrating an example of the contents of calculation in the ninth embodiment;

DESCRIPTION OF THE PREFERRED EMBODIMENTS

A description will now be provided of preferred embodiments of the present invention with reference to the drawings.

First Embodiment

Figure 1:
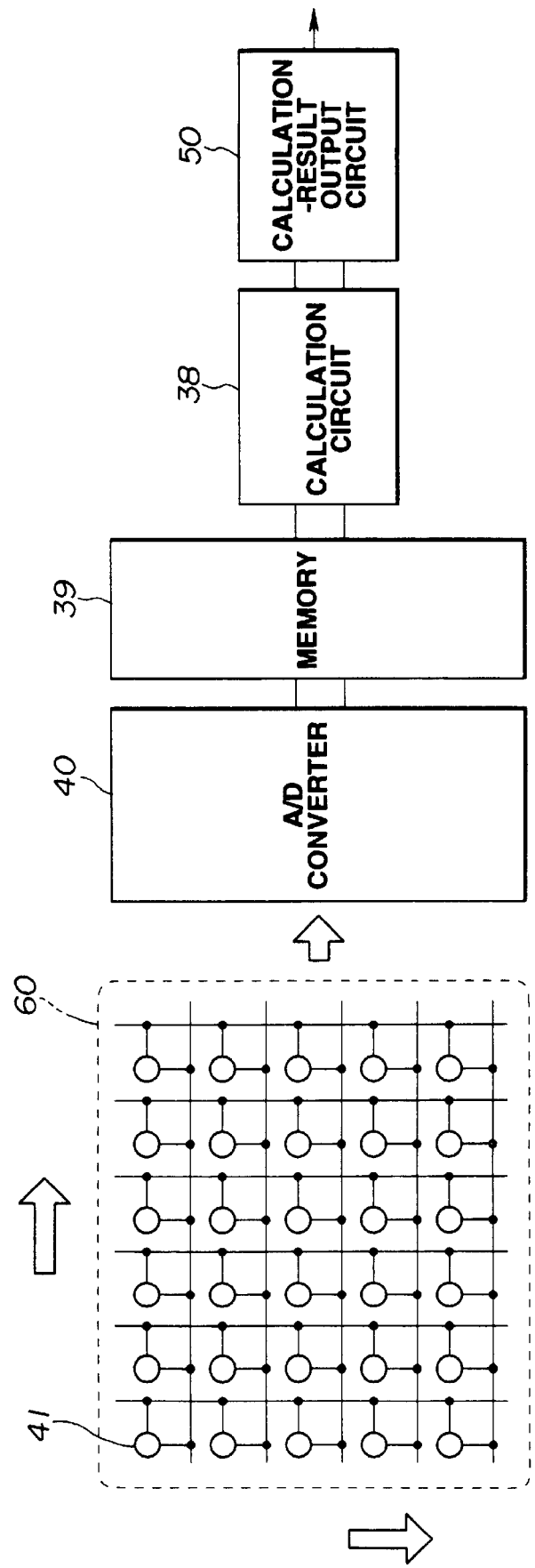
FIG. 1 is a schematic block diagram illustrating the configuration of a conventional image pickup device.
Figure 2:
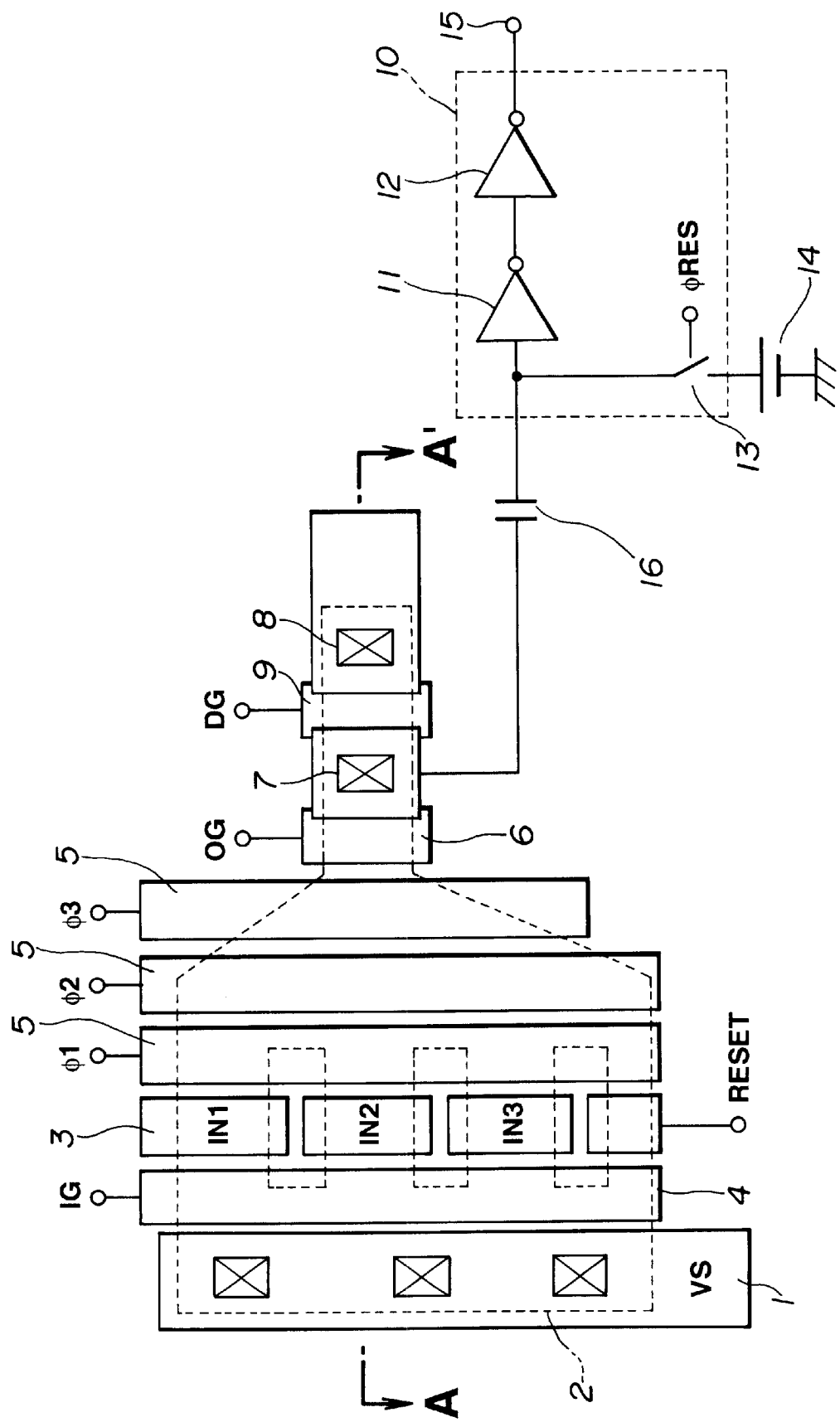
FIG. 2 is a schematic plan view illustrating the configuration of a semiconductor device according to a first embodiment of the present invention.

FIG. 2 is a schematic plan view illustrating the configuration of a semiconductor device according to a first embodiment of the present invention. In the first embodiment, a description will be provided illustrating a three-input parallel calculation circuit.

Figure 3A:
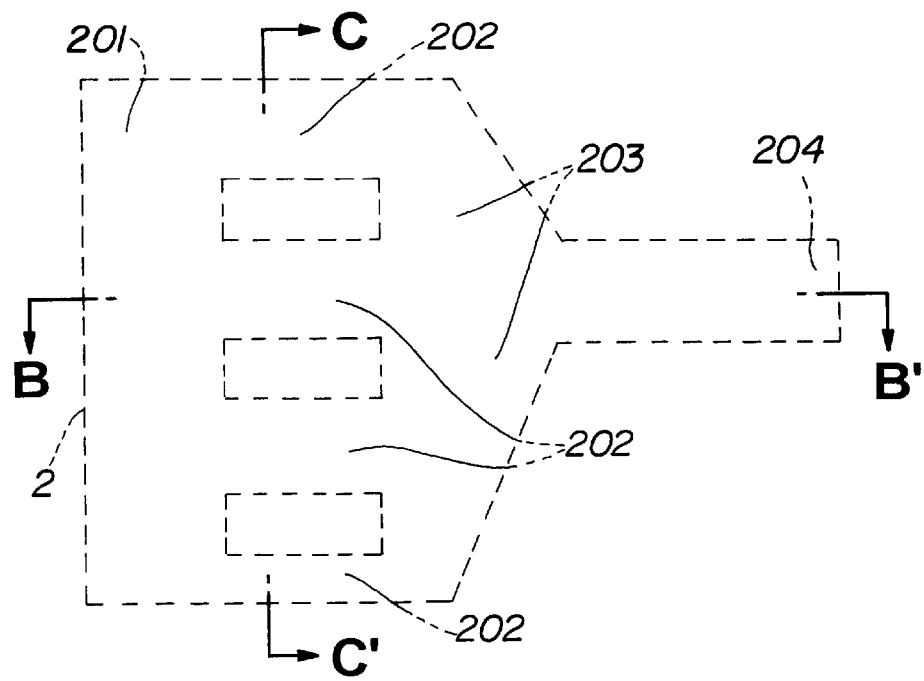
FIG. 3(A) is a schematic plan view illustrating an arrangement of oxide films of channel portions.
Figure 3B:
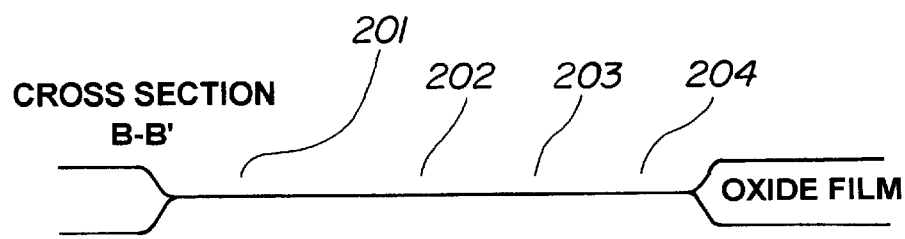
FIGS. 3(B) and 3(C) are schematic cross-sectional views of the oxide films shown in FIG. 3(A)
Figure 3C:
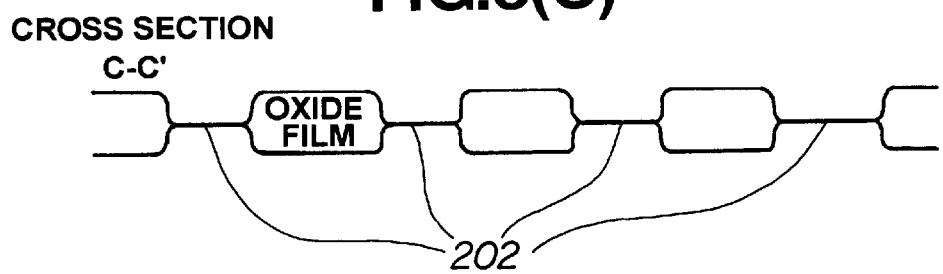

In FIG. 2, a charge supply unit 1 supplies electric charges. A charge transfer channel 2 transfers the electric charges supplied from the charge supply unit 1. As shown in FIG. 3(A), this channel 2 includes a charge supply portion 201 present at one end thereof, a branching region 202 where the electric charges input to the charge supply portion 201 branch, a transfer region 203 for transferring the electric charges by collecting the branching electric charges, and a charge discharging portion 204 for discharging the electric charges. In the branching regions 202, region separation can be performed, for example, by forming selective oxide films (using LOCOS (local oxidation of silicon)) on regions surrounded by broken lines. For example, region separation can be performed by forming oxide films as shown in the cross section of FIG. 3(B) taken along line B–B' in FIG. 3(A), and in the cross section of FIG. 3(C) taken along line C–C' in FIG. 3(A). However, region separation is not limited to such an approach. As shown in FIG. 2, gate electrodes 3 are formed on the branching region 202 via insulating films. The gate electrodes 3 comprise three input electrodes IN1, IN2 and IN3, having substantially the same gate capacitance, for inputting signals, and one electrode, having a gate capacitance substantially half the gate capacitance of each of the gate electrodes 3, for inputting a reset pulse (RESET). An input gate 4 is formed between the gate electrodes 3 and the charge supply unit 1 via an insulating film. A group of signal transfer electrodes 5 is also formed on the charge transfer channel 2 via insulating films. There are also shown an output gate 6, and a floating diffusion unit (FD unit) 7. A drain region 8 is provided so as to be adjacent to the charge discharging portion 204. A reset gate 9 is provided between the FD unit 7 and the drain region 8.

In FIG. 2, there are also shown a sense amplifier 10, which includes an inverter 11 and a second inverter 12, a reset switch 13 for resetting an input terminal of the inverter 11, a reset power supply 14, an output terminal 15 of the sense amplifier 10, and a capacitor 16 inserted in series between the FD unit 7 and the input terminal of the sense amplifier 10. Electric charges stored in the capacitor 16 are converted into a voltage, which is input to the sense amplifier 10 as an output.

Figure 4:
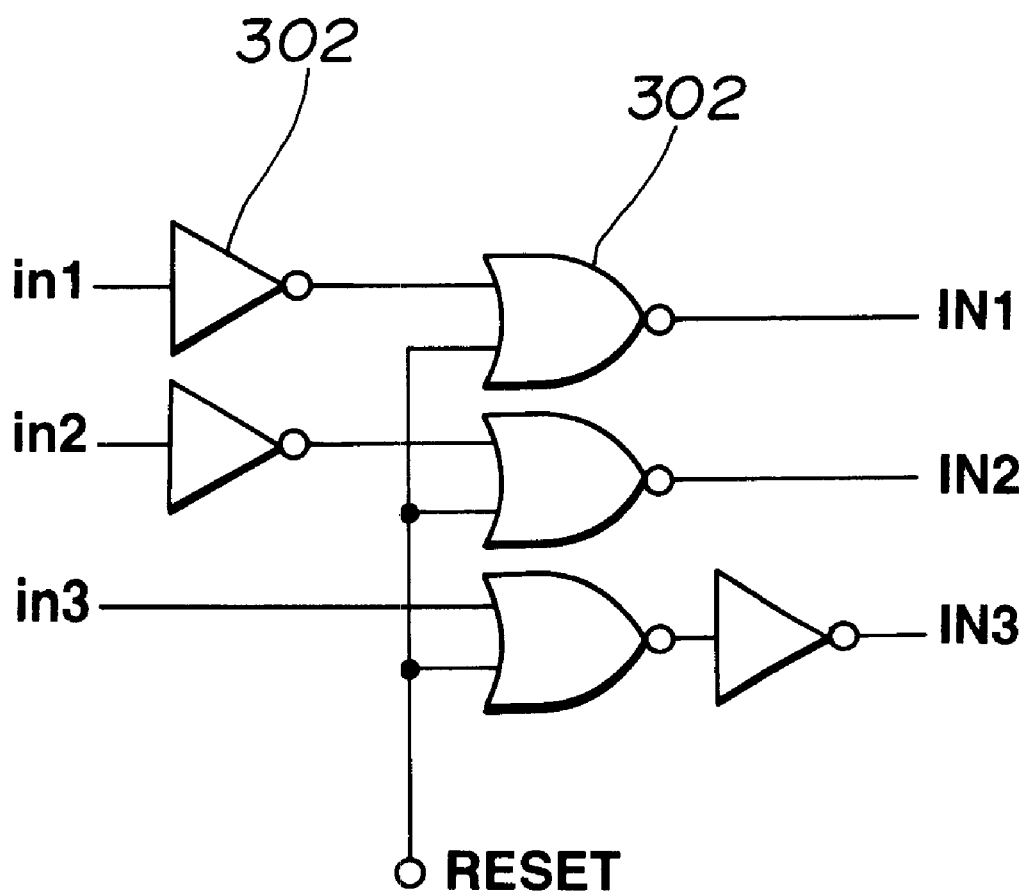
FIG. 4 is a schematic circuit diagram illustrating a signal input unit of the device shown in FIG. 2.

FIG. 4 illustrates a processing circuit for signals input to the input electrodes IN1, IN2 and IN3 of the gate electrodes 3. In FIG. 4, NOR gates 301 and inverters 302 can be formed by the processes for forming an MOS structure, or by other processes. By this processing circuit, input signals in1–in3 are applied as input signals IN1–IN3 to the gate electrodes 3 of the circuitry shown in FIG. 2 without being modified when the reset pulse assumes a low level. When the reset pulse assumes a high level, a low-level and a high-level voltage are applied to IN1 and IN2, and to IN3 of the gate electrodes 3, respectively.

Figure 5:
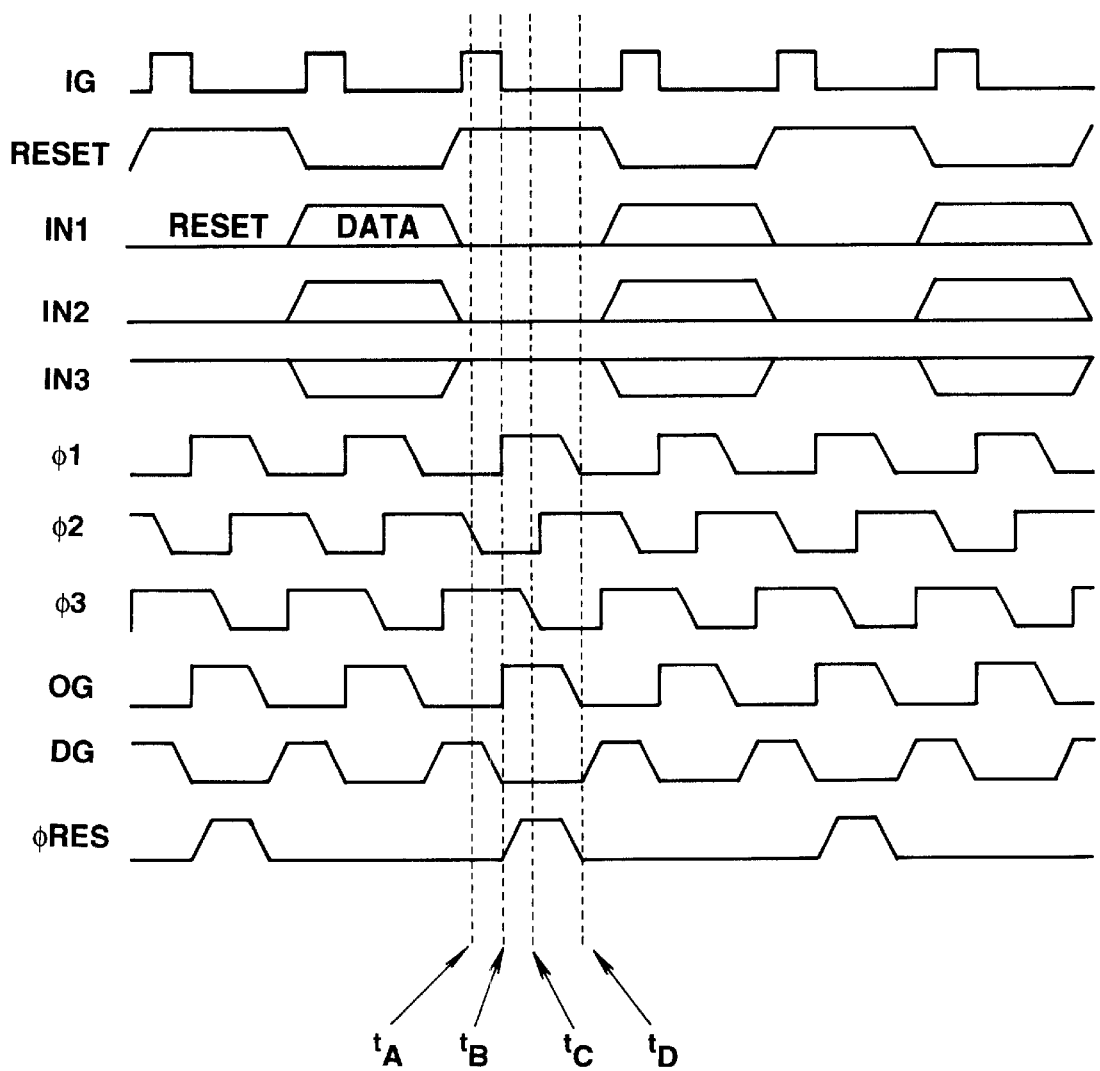
FIG. 5 is a timing chart illustrating operational timings.
Figure 6A:
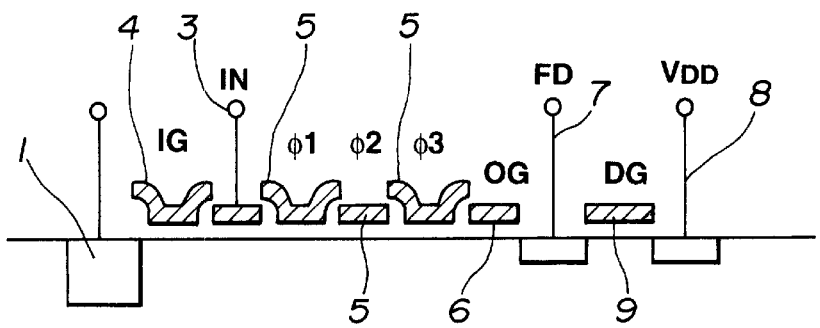
FIG. 6(A) is a schematic cross-sectional view of a charge transfer portion of the device shown in FIG. 2.
Figure 6B:
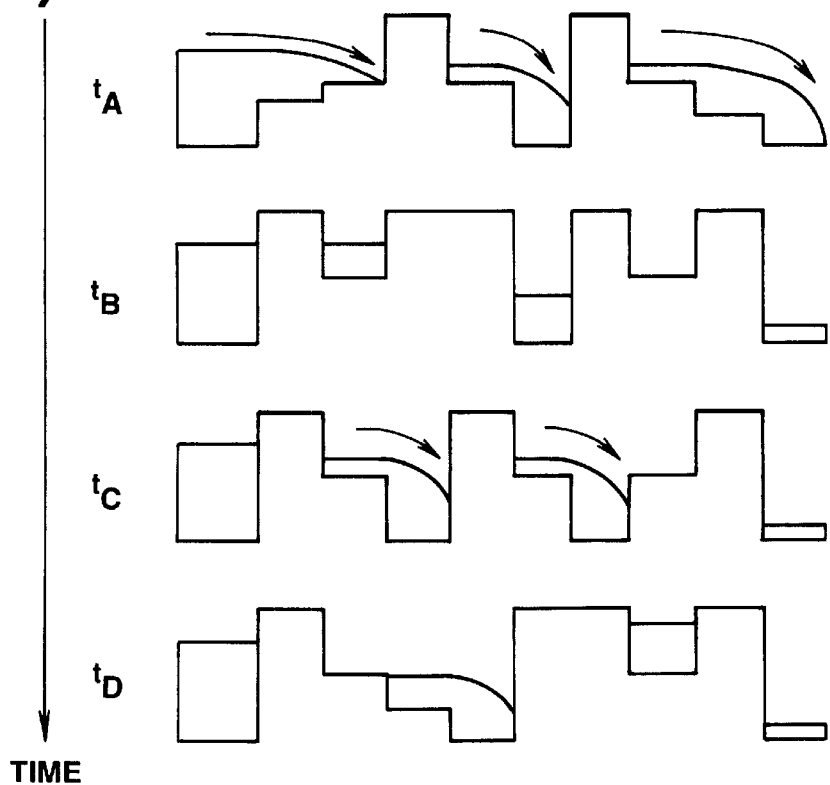
FIG. 6(B) is a schematic diagram illustrating the operation of the charge transfer portion shown in FIG. 6(A)

FIG. 5 is a diagram illustrating operational timings of the circuitry of the first embodiment. FIG. 6(A) is a cross-sectional view taken along line A–A' shown in FIG. 2. The operation of the circuitry of the first embodiment will now be briefly described with reference to FIG. 5. Electric charges are supplied from the charge supply unit 1 (FIG. 2) to the charge transfer channel 2 and are transferred by a pulse IG applied to the input gate 4. Input signals from the processing circuit shown in FIG. 4 are supplied to the IN1–IN3 of the gate electrodes, and electric charges corresponding to the input levels are sequentially transferred in accordance with pulses φ1–φ3 applied to the transfer electrode 5, are then transferred to the FD unit 7 in accordance with the level OG of the output gate 6, and are output to the sense amplifier 10. At that time, electric charges accumulated under the FD unit 7 are reset in accordance with the level of the reset gate 9. FIG. 6(B) illustrates changes in potentials within the substrate and a manner of charge transfer corresponding to FIG. 6(A).

The operation of the first embodiment will now be described with reference to FIGS. 2 through 6(B). Although, in the following description, a case of an n-channel device (in which signal charges comprise electrons) is considered, the contents of the description are also effective for a p-channel device (in which signal charges comprise holes).

In FIG. 2, a positive voltage $V_{DD}$ is applied to the drain region 8, and electric charges are supplied from the charge supply unit 1 to the charge transfer channel 2. When the input gate 4 is turned on by a high-level pulse IG in this state, signal charges are supplied under the gate electrodes 3 (at a timing $t_A$).

At that time, if the RESET pulse assumes a high level, as described above, a depletion layer is formed only under the gate electrode 3 to which the input signal IN3 and the RESET pulse have been applied, and electric charges are accumulated. If the gate capacitance of the gate electrode 3 to which the RESET pulse has been applied is represented by C, since the value C is about half the gate capacitance of the gate electrode 3 to which the input signal IN3 has been applied, the total electric charges accumulated under the gate electrodes 3 to which the input signal IN3 and the RESET pulse have been applied are about 3CV (where V is a voltage applied to the depletion layer). On the other hand, if the RESET pulse assumes a low level, depletion layers are formed only under the gate electrodes 3 to which high-level signals from among the input signals IN1–IN3 have been applied and electric charges are accumulated under such electrodes. If the number of the high-level signals is represented by N, the total electric charges accumulated under the gate electrodes 3 are about 2NCV.

Electric charges accumulated under the transfer electrode 5 driven by the pulse φ2 at the same timing are transferred to a portion under the transfer electrode 5 driven by the pulse φ3, and electric charges accumulated under the FD unit 7 are reset through the reset gate 9 (at a timing $t_B$).

At the next timing, the respective electric charges accumulated under the gate electrodes 3 are transferred to a portion under the transfer electrode 5 driven by the pulse φ1, to provide a single charge packet. At the substantially the same timing, the electric charges accumulated under the transfer electrode 5 driven by the pulse φ3 are transferred to a portion under the output gate 6 (at a timing $t_C$).

The electric charges transferred to a portion under the transfer electrode 5 driven by the pulse φ1 are transferred to a portion under the transfer electrode 5 driven by the pulse φ2, and to a portion under the transfer electrode 5 driven by the pulse φ3 at the next timing. The electric charges under the output gate 6 are transferred to a portion under the FD unit 7 (at a timing $t_D$).

Thus, the electric charges accumulated under the gate electrodes 3 in accordance with the input signals are collected in the form of a single charge packet at the transfer electrode 5, and the obtained charge packet is transferred to the FD unit 7. Electric charges having the value 3CV corresponding to a reset period and electric charges having the value 2NCV corresponding to a signal-input period are alternately supplied.

As shown in FIG. 5, at the timing of transfer of electric charges having the value 3CV corresponding to a reset period to the FD unit 7, the input terminal of the inverter 11 within the sense amplifier 10 is reset by providing a conducting state of the reset switch 13 by a reset pulse φRES. At that time, a value close to the logic inversion voltage where the output of the inverter is inverted is selected as the reset voltage. When the reset pulse φRES is turned off, the input terminal of the inverter 11 is held at the reset potential. When the electric charges having the value 2NCV corresponding to a signal-input period are there-after transferred to the FD unit 7, the potential of the input terminal of the inverter 11 changes.

For example, if the parasitic capacity of the FD unit 7 is represented by $C_{FD}$, a change in the potential of the input terminal of the inverter 11 is expressed by:

$$(2NCV-3CV)/C_{FD} \tag{1}$$

When the voltage of the input terminal of the inverter 11 changes from the vicinity of the logic inversion voltage, the voltage of the output terminal of the inverter 11 is thereby inverted. After all, when at least two of the three inputs assume a high level (when N≧2) and a low level, the input terminal of the inverter 11 shifts to a potential higher than the logic inversion voltage and to a potential lower than the logic inversion voltage, so that a high-level signal and a low-level signal are output to the output terminal 15 of the sense amplifier 10, respectively.

According to the above-described operation, the circuitry of the first embodiment outputs a high-level signal when a majority of multiple signals input in parallel assume a high level.

Although, in the first embodiment, a description has been provided of the case of three-input circuitry, the present invention is not limited to such an approach, but can, of course, be applied to circuitry having a larger number of inputs. The superiority of the circuitry of the present invention to conventional parallel calculation circuitry increases as more complicated calculation with a large number of parallel inputs is performed.

The circuitry of the first embodiment is not limited to the above-described majority determination circuit. For example, all signals can be subjected to parallel calculation processing using a sense amplifier by performing desired weighting in accordance with processing to be performed for each signal depending on the amplitude of the signal and the gate capacitance of the gate electrode 3 to which the signal is input.

Although, in the first embodiment, a description has been provided illustrating charge transfer using three-phase clock signals φ1–φ3, the present invention is not limited to such an approach. For example, the same effects can, of course, be obtained by a charge transfer method using a single-phase clock signal, two-phase clock signals, four-phase clock signals and the like.

As a result, high-speed and high-accuracy parallel calculation can be performed with low electric power consumption. The scale of circuitry increases at most in proportion to an increase in the number of inputs. Hence, the scale of circuitry can be greatly reduced and the production yield can be increased compared with conventional parallel calculation circuitry. In addition, electric power consumption is, of course, further reduced in accordance with the reduction in the scale of circuitry and an increase in the calculation speed.

Second Embodiment

Figure 7:
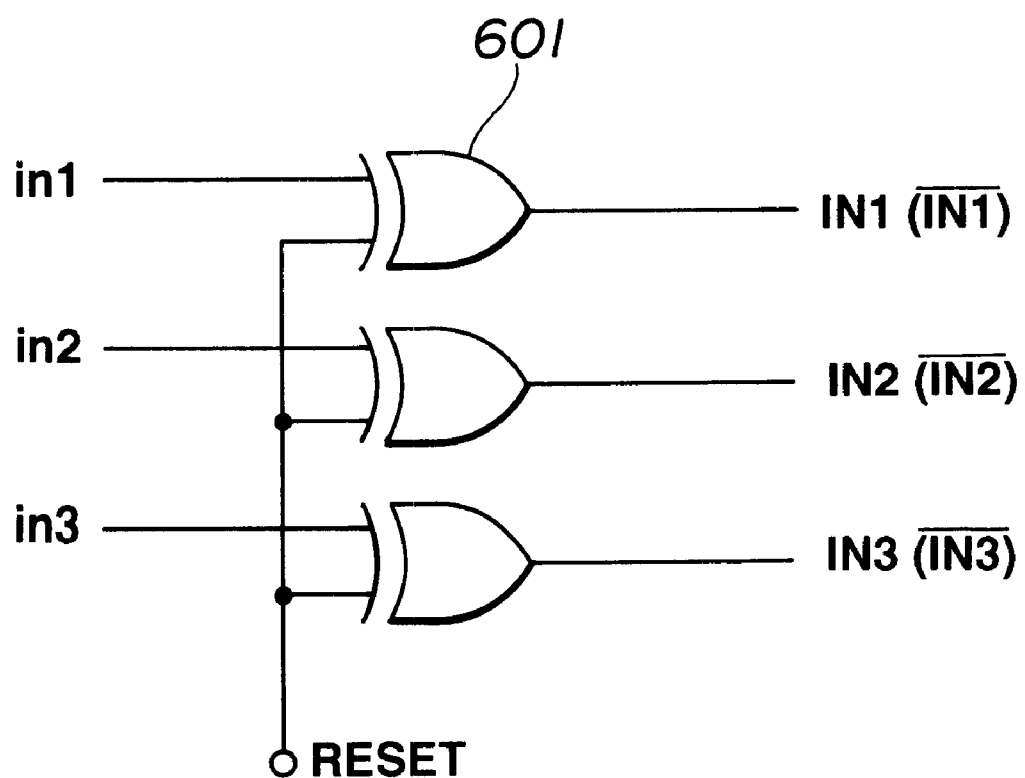
FIG. 7 is a schematic circuit diagram illustrating a signal input unit according to a second embodiment of the present invention.

FIG. 7 illustrates a circuit for processing signals input to the gate electrodes 3, according to a second embodiment of the present invention. In FIG. 7, reference numeral 601 represents an EXOR gate. The EXOR gates may be formed by the same processes for manufacturing the semiconductor device shown in FIG. 2, or they may be formed independently.

According to the above-described processing circuit, when the reset pulse assumes a low level, the input signals in1–in3 are applied as input signals IN1–IN3 to the gate electrodes 3 shown in FIG. 2 without being modified. When the reset pulse assumes a high level, signals obtained by inverting the signals in1–in3 are applied.

In the second embodiment, a larger amount of change in the potential at the input terminal of the inverter 11 of the sense amplifier 10 than in the first embodiment can be obtained, and therefore calculation with higher accuracy can be performed.

By applying the same analysis as in the first embodiment to the case of three inputs in1–in3 shown in FIG. 7, electric charges during a reset period have a value of 2(3−N)CV, and electric charges for an input signal have a value of 2NCV. If the parasitic capacity of the FD unit 7 is represented by $C_{FD}$, a change in the input terminal of the inverter 11 is expressed by:

$$(2NCV-2(3-N)CV/C_{FD}=2(2NCV-3CV)/C_{FD} \quad (2).$$

It can be understood that this value is twice the value in the first embodiment.

According to the second embodiment, more precise calculation than in the first embodiment can be performed.

Although, in the second embodiment, a description has been provided of the case of three inputs, the second embodiment is not limited to such an approach, but can, of course, be applied to multi-input signal processing.

Third Embodiment

Figure 8:
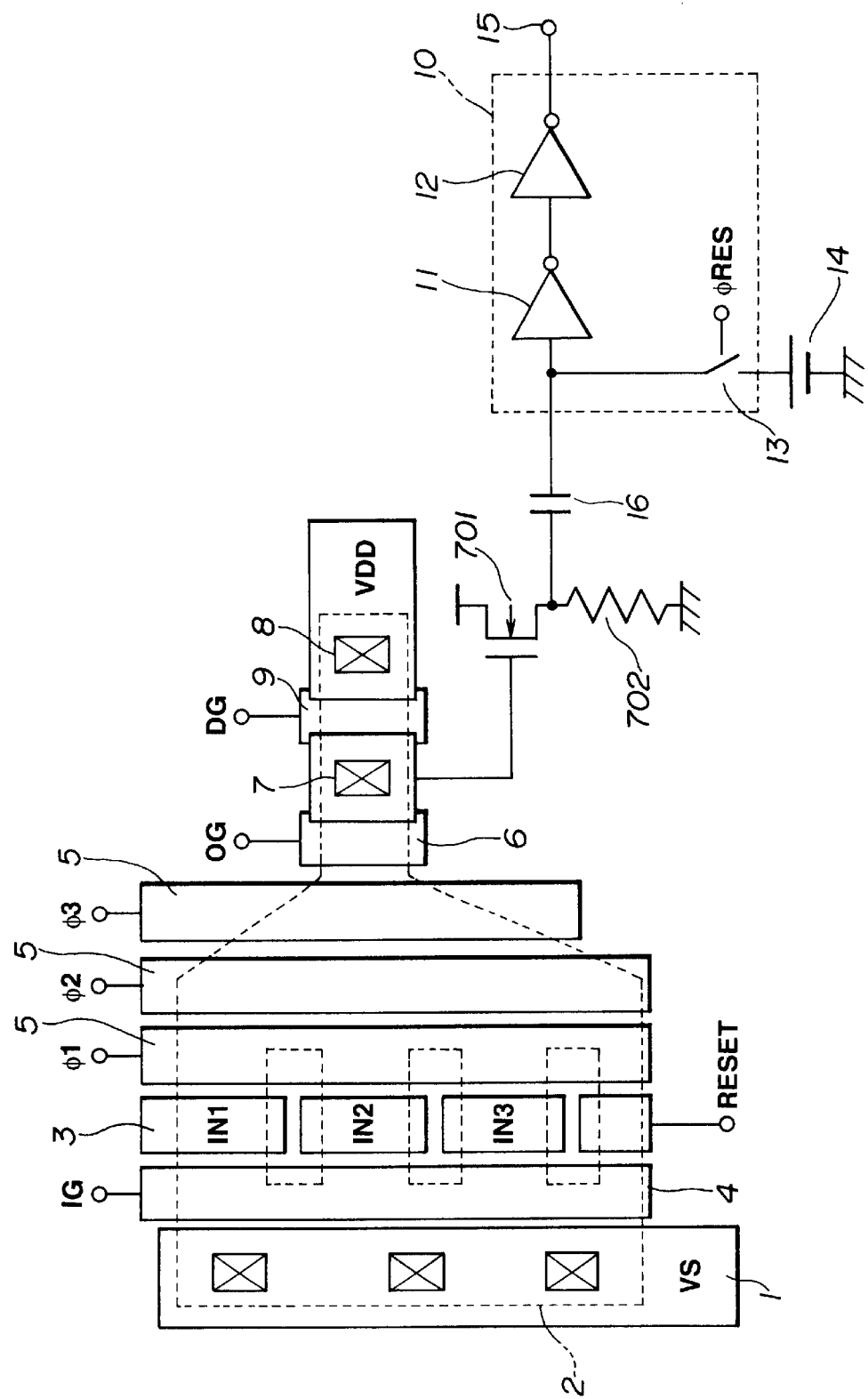
FIG. 8 is a schematic plan view illustrating the configuration of a semiconductor device according to a third embodiment of the present invention.

A description will now be provided of a third embodiment of the present invention with reference to the schematic diagram shown in FIG. 8. In the third embodiment, a source-follower amplifier is connected to the output of an FD unit 7. In FIG. 8, an MOS transistor 701 and a resistor 702 constitute the source-follower amplifier. By performing current amplification by the source-follower amplifier and inputting the obtained signal to a sense amplifier 10, the stages before and after the source-follower amplifier can be separated from each other. Thus, it is possible to prevent influence of reset noise and the like of a reset switch 13 generated in the sense amplifier 10 on the potential of the FD unit 7, and therefore to peform more precise calculation.

Fourth Embodiment

Figure 9A:
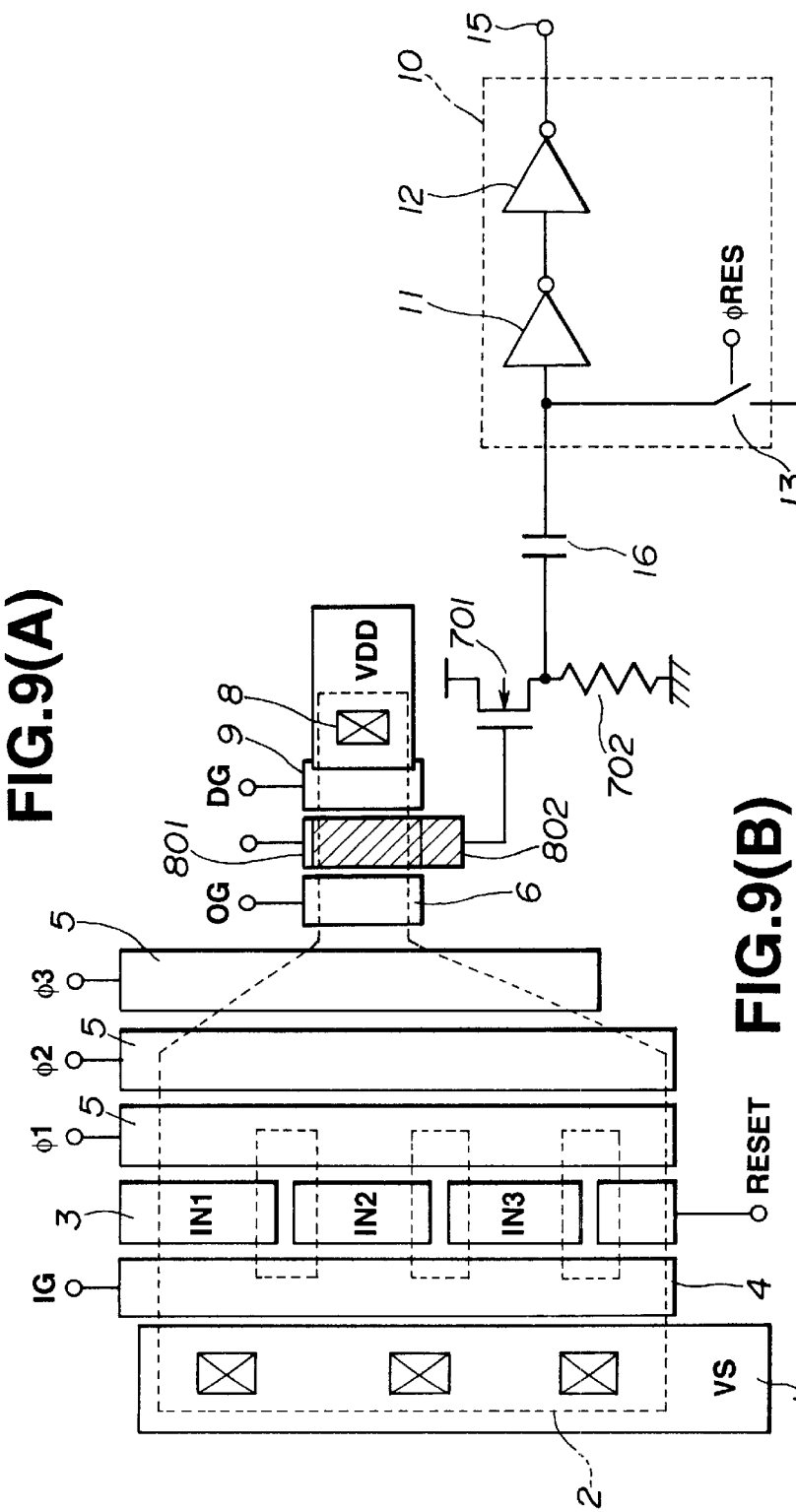
FIG. 9(A) is a schematic plan view illustrating the configuration of a semiconductor device according to a fourth embodiment of the present invention.
Figure 9B:
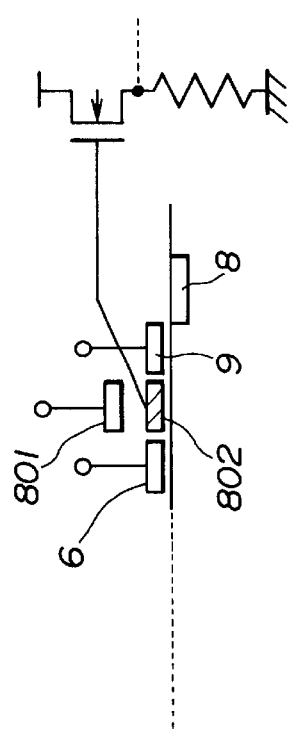
FIG. 9(B) is a schematic cross-sectional view illustrating a charge detection circuit of the device shown in FIG. 9(A)
Figure 10:
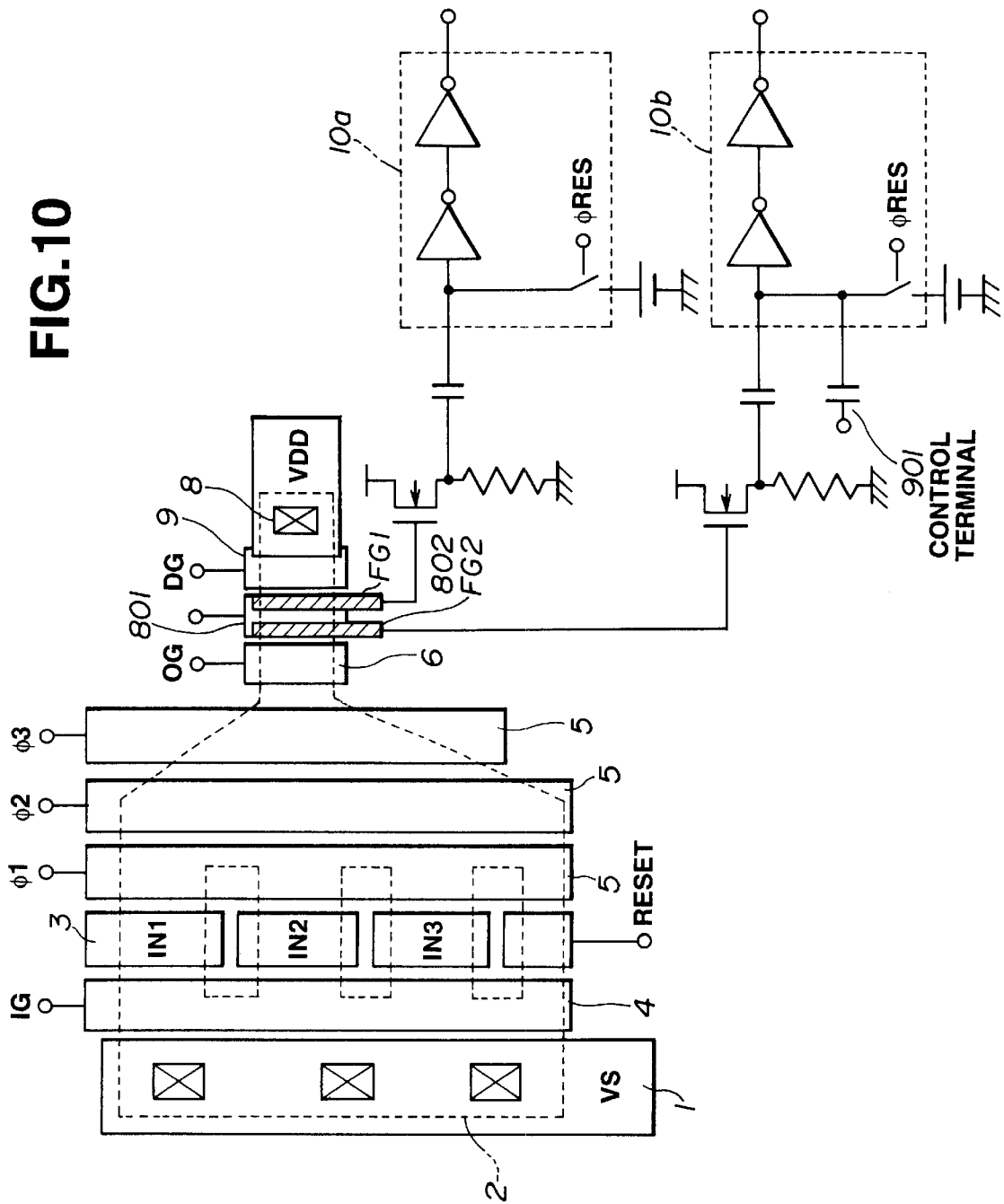
FIG. 10 is a schematic plan view illustrating a modification of the semiconductor device shown in FIG. 9(A)

A description will now be provided of a fourth embodiment of the present invention with reference to the schematic diagrams shown in FIGS. 9(A) and 9(B). FIG. 9(A) is a schematic plan view illustrating a semiconductor device according to the fourth embodiment. FIG. 9(B) is a schematic cross-sectional view of a floating-gate amplifier (FGA) portion of the device shown in FIG. 9(A). In the fourth embodiment, a floating-gate amplifier is used for a charge detection circuit. In FIGS. 9(A) and 9(B), reference numeral 801 represents a control electrode, and reference numeral 802 represents a floating electrode. The potential of the floating electrode 802 is controlled by a control voltage applied to the control electrode 801. When signal charges supplied from a transfer electrode 5 are accumulated under the floating gate 802, the surface potential of the semiconductor substrate changes due to the signal charges, whereby the potential of the floating gate 802 also changes. This change in the potential of the floating gate 802is input to the source-follower amplifier and then to the sense amplifier to obtain an output. Compared with the FD amplification circuit described in the first embodiment, the FGA circuit has the advantage that signal charges can be output without being destroyed. Accordingly, for example, as shown in FIG. 10, a plurality of outputs can be taken out by providing a plurality of FGA circuits, so that complicated signal processing can be performed at a high speed. According to the structure shown in FIG. 10, by a control voltage applied to the control electrode 801, signal charges stored under floating gates 802 FG1 and 802 FG2 are input to sense amplifiers 10a and 10b via corresponding source-follower amplifiers, respectively. A control terminal 901 is provided in the sense amplifier 10b, so that the sense amplifier 10b can perform logic calculation different from that of the sense amplifier 10a.

The charge detection circuit is not limited to the above-described FD amplification circuit or FGA circuit. For example, a method proposed in "A High Sensitivity Output Amplifier For CCD Image Sensor" IEDM 87 may be adopted.

Fifth Embodiment

Figure 11:
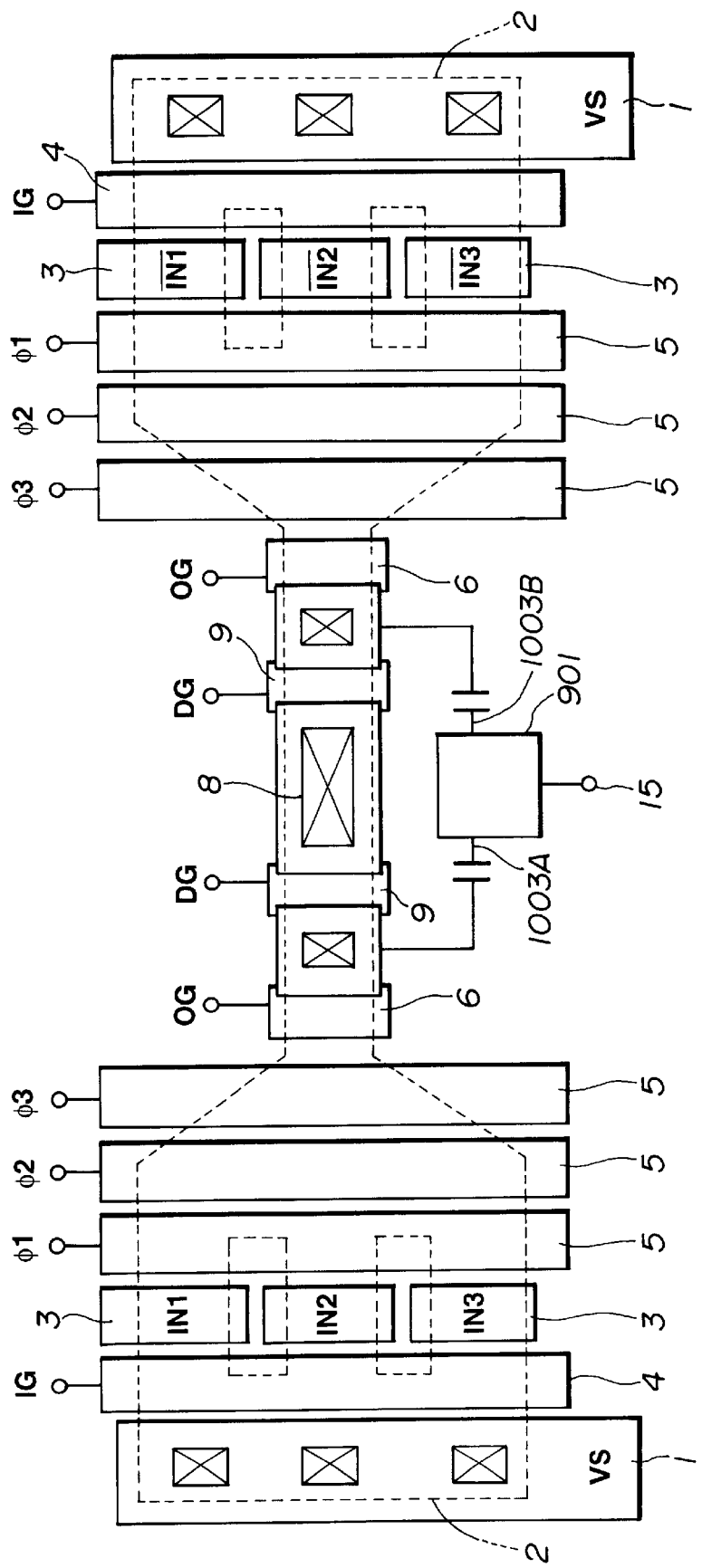
FIG. 11 is a schematic plan view illustrating the configuration of a semiconductor device according to a fifth embodiment of the present invention.
Figure 12:
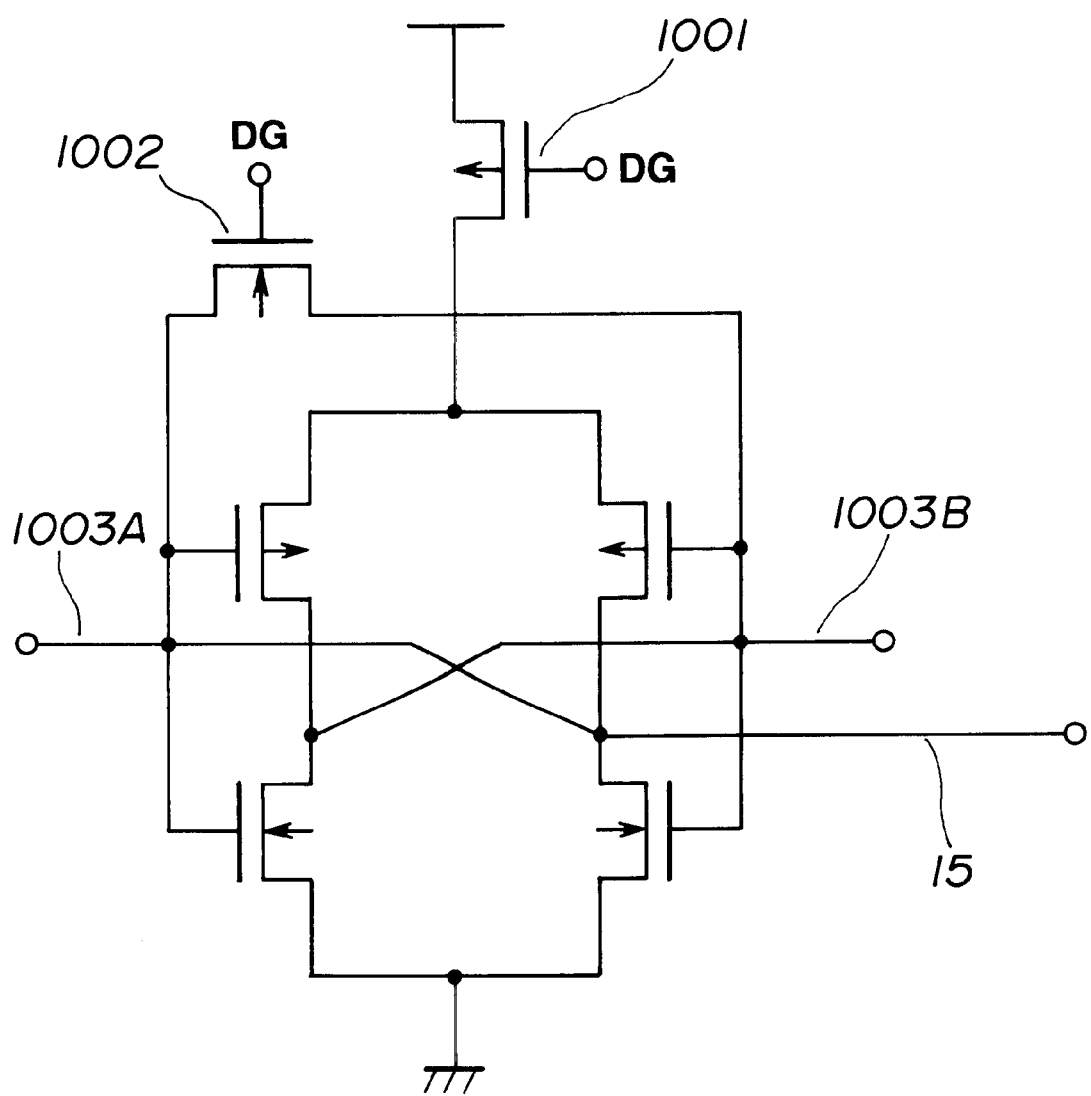
FIG. 12 is a schematic circuit diagram illustrating a sense amplifier of the device shown in FIG. 11.
Figure 13:
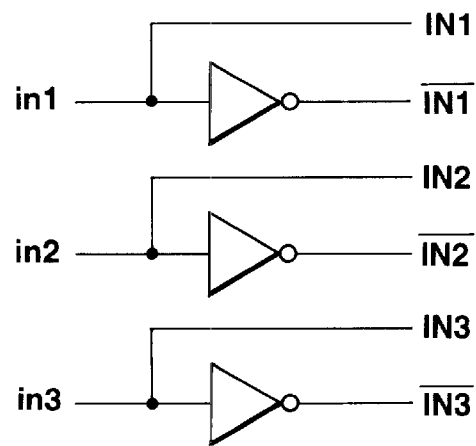
FIG. 13 is a schematic circuit diagram illustrating a signal input unit of the device shown in FIG. 11.

A description will now be provided of a fifth embodiment of the present invention with reference to the schematic diagram of a semiconductor device shown in FIG. 11. In the fifth embodiment, a differential sense amplifier is used as the sense amplifier. In FIG. 11, reference numeral 901 represents a differential sense amplifier, and reference numeral 15 represents an output terminal. Reference numerals 1003A and 1003B are input terminals of the sense amplifier 901. FIG. 12 illustrates an example of the structure of the differential sense amplifier 901. In FIG. 12, there are shown the input terminals 1003A and 1003B, a switch 1001, and a reset switch 1002. FIG. 13 illustrates a circuit for processing signals input to gate electrodes 3 of the fifth embodiment.

In the circuit of the fifth embodiment, signals IN1–IN3 and inversion signals of the signals IN1–IN3 are input to the input terminal 1003A and to the input terminal 1003B, respectively, of the differential sense amplifier 901. Accordingly, when a majority of three inputs in1–in3 assume a high level, the input terminal 1003A of the differential sense amplifier 901 is maintained at a potential higher than the potential of the input terminal 1003B, whereby a latch operates to output a high-level signal.

Since the circuit of the differential sense amplifier of the fifth embodiment has the configuration of a latch, the output voltage always rises (or descends) to the power-supply voltage. Accordingly, it is possible to perform precise calculation even for a small change in the input, and to obtain an output signal having a sufficient logic amplitude.

Sixth Embodiment

Figure 14:
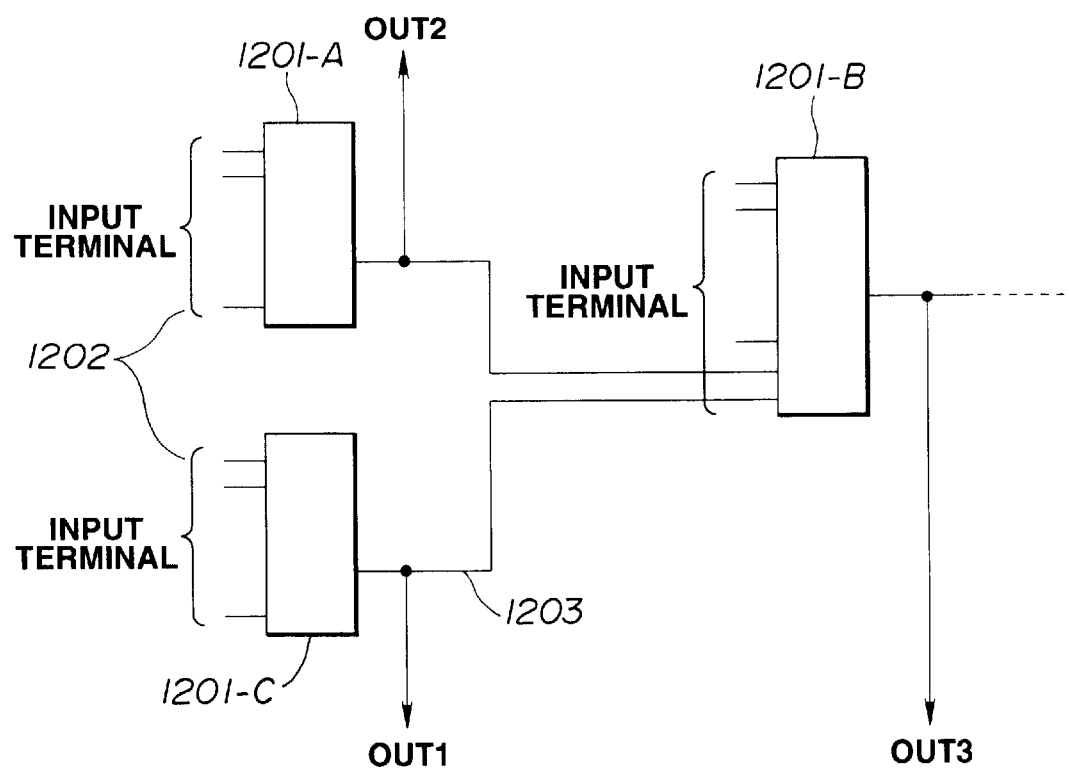
FIG. 14 is a block diagram illustrating a semiconductor circuit utilizing a semiconductor device of the invention, according to a sixth embodiment of the present invention.

A description will now be provided of a sixth embodiment of the present invention with reference to the schematic diagram of a device shown in FIG. 14. In the seventh embodiment, by connecting a plurality of parallel calculation circuits of the present invention, higher-grade parallel calculation can be realized.

In FIG. 14, reference numerals 1201A–1201C represent parallel calculation blocks according to one of the first through fourth embodiments, each of which includes, as shown in FIG. 2, multiple input terminals, and the charge transfer channel 2, the gate electrodes 3, the sense amplifier 10 and the like. There are shown input terminals 1202, and output terminals 1203 from the sense amplifier 10 which correspond to the output terminal 15 shown in FIG. 2. The output terminals 1203 of the parallel calculation circuit blocks 1201A and 1201C are connected to the parallel calculation circuit block 1201B. Signals output from the output terminals 1203 become input signals to corresponding input terminals of the parallel calculation circuit block 1201B. Outputs of similar parallel calculation circuit blocks are connected to other input terminals. By thus connecting a plurality of parallel calculation circuit blocks according to one of the above-described embodiments in series, in parallel, or in series and in parallel, higher-degree parallel calculation processing can be realized. For example, in FIG. 14, if each of the parallel calculation circuit blocks has the function of majority determination, when a majority of a plurality of inputs to the parallel calculation circuit block 1201C assume a high level, a high-level signal is output to an output OUT1. When a majority of a plurality of inputs of the parallel calculation circuit block 1201A assume a high level, a high-level signal is output to an output OUT2. When a majority of a plurality of input terminals including the outputs OUT1 and OUT2 of the parallel calculation circuit block 1201B assume a high level, a high-level signal is output to an output OUT3.

Although, in the sixth embodiment, a description has been provided of the case of connecting three parallel calculation circuit blocks, the present embodiment is, of course, not limited to such an approach. Any number of parallel calculation circuit blocks may be freely combined in order to realize desired calculation processing. It is, of course, possible to combine parallel calculation circuit blocks according to the present invention with conventional semiconductor logic circuit blocks.

Although, in the sixth embodiment, a description has been provided illustrating a case of connection in which signals are sequentially propagated, the present embodiment is not limited to such an approach. For example, outputs of a succeeding stage may be used as input signals to a preceding stage.

Seventh Embodiment

Figure 15:
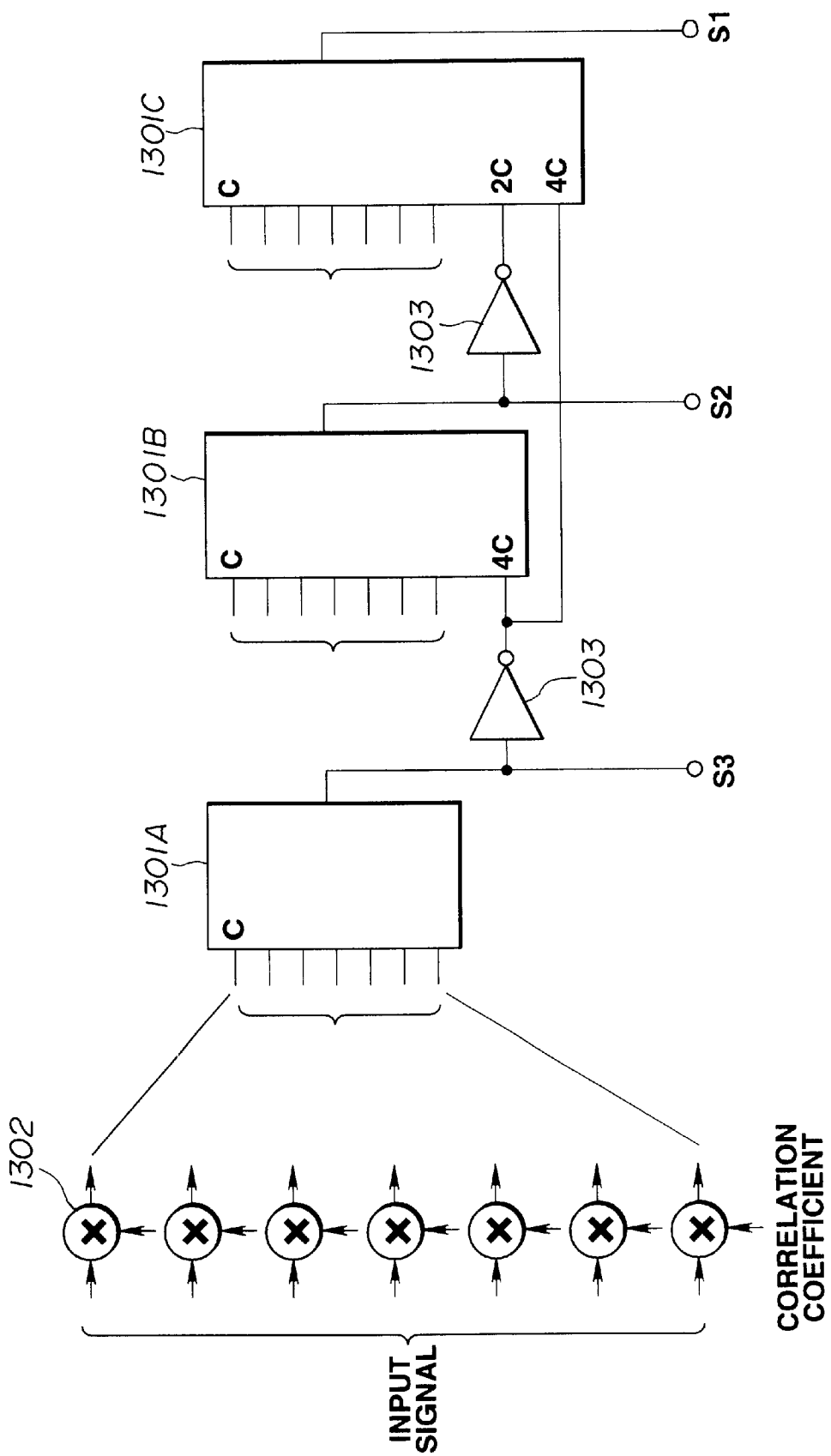
FIG. 15 is a block diagram illustrating a semiconductor circuit utilizing a semiconductor device of the invention, according to a seventh embodiment of the present invention.

FIG. 15 is a schematic diagram in which parallel calculation circuit blocks according to one of the above-described first through fourth embodiments are applied to a correlation calculation circuit, according to a seventh embodiment of the present invention. In FIG. 15, there are shown parallel calculation circuit blocks 1301A–1301C according to one of the above-described embodiments, comparators 1302, each for outputting a high-level or low-level output as a result of determination if each input signal coincides with a correlation coefficient, and inverters 1303.

The parallel calculation circuit block 1301A is a majority determination circuit having seven input terminals connected to the corresponding input gate electrodes 3, each having a minimum capacitance C. When the number of high-level signals from among seven input signals is equal to or greater than 4, i.e., the majority, this circuit outputs a high-level signal.

The parallel calculation circuit block 1301B is a majority determination circuit having eight input terminals, seven of which are connected to the corresponding input gate electrodes 3, each having a capacitance C, and the remaining one of which is connected to the input gate electrode 3 having a capacitance 4C. This block can store electric charges under the gate electrodes having a maximum capacitance of 11C. When signal charges are stored in a capacitance equal to or greater than 6C and are trasnferred to a charge detection unit, a high-level signal is output according to the operation described in the first embodiment.

The parallel calculation circuit block 1301C is a majority determination circuit having nine input terminals, seven of which are connected to the corresponding input gate electrodes 3, each having a capacitance C, and one of which is connected to the input gate electrode 3 having a capacitance 4C, and the remaining one of which is connected to the input gate electrode 3 having a capacitance 2C. This block can store electric charges under the gate electrodes having a maximum capacitance of 13C. When signal charges are stored in a capacitance equal to or greater than 7C, a high-level signal is output.

In FIG. 15, signals are first input to the corresponding comparators 1302 together with corresponding correlation coefficients. When each signal coincides and does not coincide with the corresponding correlation coefficient, the corresponding comparator 1302 outputs a high-level signal and a low-level signal, respectively. The outputs of the comparators 1302 are input to the majority calculation circuit blocks 1301A–1301C. For example, when the outputs of the comparators 3 are input to the 7-input majority calculation circuit blocks 1301A, if the number of high-level input signals exceeds the majority, i.e., if at least four inputs from among seven inputs assume a high-level, a high-level signal is output from the majority calculation circuit block 1301A. The output values from the majority calculation circuit block 1301A for respective numbers of high-level input signals are shown in S3 of Table 1.

TABLE 1

| Input | S3 | S2 | S1 |
| --- | --- | --- | --- |
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

Then, the polarity of the output S3 is inverted by the inverter 1303, and the resultant signal is supplied to the weighting input terminal having the capacitance 4C of the majority calculation circuit block 1301B. As described above, this circuit block 1301B is a charge majority determination calculation circuit which can store electric charges under the gate electrodes having the capacity 11C, and which determines if electric charges are accumulated under a majority of capacitance values. For example, if at least four of the seven inputs assume a high level, a low-level signal is applied to the weighting input terminal, as described above, and electric charges are not accumulated under the gate electrode having the capacitance 4C to which the terminal is connected. If at least six inputs from among seven inputs supplied to input terminals other than the weighting input terminal assume a high level, it is determined that electric charges are accumulated under a majority of capacitance values, and a high-level signal is output. If the number of high-level inputs from among the seven inputs is at least four and equal to or less than five, the capacitance value does not reach the majority, and therefore a low-level signal is output. On the other hand, if the number of high-level inputs from among seven inputs is equal to or less than 3, a high-level signal is supplied to the weighting input terminal, and electric charges are accumulated under the gate electrodes having the capacitance 4C to which the terminal is connected. When the number of high-level inputs from among the seven inputs is at least two and equal to or less than three, since 4+2 or 4+3 is equal to or greater than 6, it is determined that the number reaches the majority, and therefore a low-level signal is output. When the number of high-level inputs from among the seven inputs is equal to or less than one, since 4+0 or 4 +1 is less than six, a low-level signal is output. The output values of the majority calculation circuit block 1301B for respective numbers of high-level input signals are shown in S2 of Table 1.

As for the majority calculation circuit block 1301C, by inverting the outputs of the majority calculation circuits 1301A and 1301B and supplying two weighting terminals having capacitance values 4C and 2C with resultant signals, respectively, outputs as shown in S1 of Table 1 can be obtained.

According to the above-described circuit configuration, it is possible to convert the number of inputs where the signal coincides with the correlation coefficient from among a plurality of inputs into a three-digit binary number, and to output the obtained binary number.

By using the circuit configuration of the seventh embodiment, it is possible to realize a correlation calculation circuit, whose scale is smaller than conventional circuits, and which can perform high-speed calculation and has small electric power consumption.

Eighth Embodiment

Figure 16:
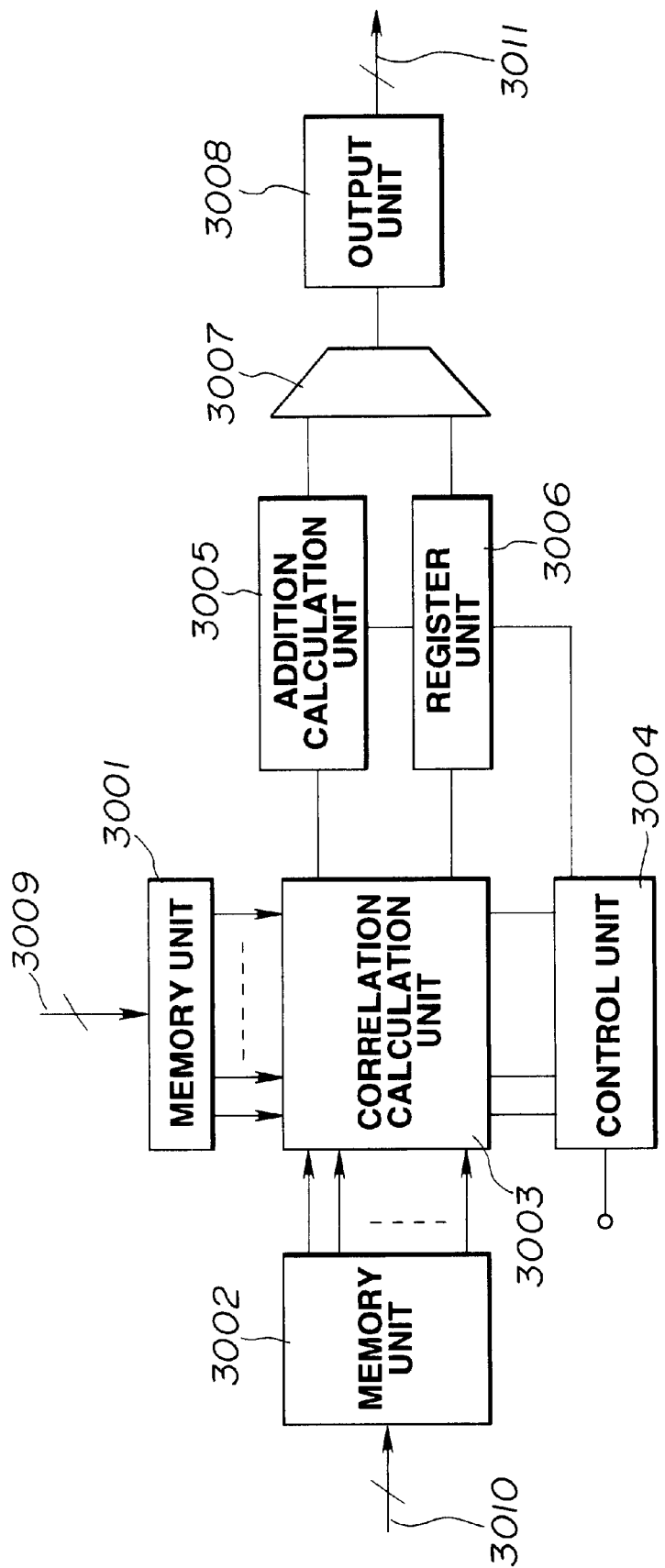
FIG. 16 is a schematic block diagram illustrating a correlation calculation circuit according to an eighth embodiment of the present invention.

FIG. 16 illustrates an eighth embodiment of the present invention. In the eighth embodiment, the semiconductor device of the present invention is combined with the conventional circuit technique to realize a motion detection chip. In FIG. 16, memory units 3001 and 3002 store reference data and data for comparison, respectively. Reference numeral 3003 represents a correlation calculation unit. A control unit 3004 controls the entire chip. An addition calculation unit 3005 adds results of correlation. A register unit 3006 stores the minimum value of the results of addition of the addition calculation unit 3005. A comparator 3007 stores the minimum value. An output buffer 3008 stores output results. a reference-data string is input to a terminal 3009, and a data string to be compared with the reference-data string is input from an input terminal 3010.

Each of the memory units 3001 and 3002 comprises an SRAM (static random access memory), and is configured by an ordinary CMOS circuit. Since the correlation calculation unit 3003 is configured by the correlation unit of the present invention, data transmitted to the correlation calculation unit 3003 is subjected to parallel processing calculation. Accordingly, calculation can be performed at a very high speed. In addition, the chip can be configured by a small number of elements, and therefore the size and the production cost of the chip can be reduced. The results of correlation calculation by the correlation calculation unit 3003 are added by the addition calculation unit 3005. The obtained value is compared with the maximum correlation result (having a minimum value of addition) obtained before the current correlation calculation and stored in the register unit 3006 by the comparator 3007. If the result of addition is smaller than the minimum value of addition of preceding calculation operations, the result is newly stored in the register unit 3006. If the result of addition of preceding calculation operations is smaller than the current result of addition, the stored value is maintained.

By performing such an operation, the maximum correlation result is always stored in the register unit 3006. After calculation of the entire data string has been completed, the stored result is output from the terminal 3011. In the eighth embodiment, the control unit 3004, the addition calculation unit 3005, the register unit 3006, the comparator 3007 and the output buffer 3008 are configured by a CMOS circuit. Particularly, by adopting the circuit configuration described in one of the above-described first through fifth embodiments for the addition calculation unit 3005, it is possible to realize parallel addition with a simple configuration, and to realize higher-speed processing. As described above, since calculation is executed at a high speed and with a low cost on the basis of a capacitance, it is possible to realize low current consumption and low power. Hence, the approach of the eighth embodiment is suitable for portable apparatuses, such as 8-mm camcorders and the like.

Ninth Embodiment

FIGS. 17(A) through 17(C) illustrate a ninth embodiment of the present invention. In the ninth embodiment, a semiconductor device of the present invention is combined with a photosensor (solid-state image pickup device) to provide a chip (high-speed image processing device) for performing high-speed image processing before reading image data. FIG. 17(A) is a schematic diagram illustrating the entire configuration of the chip. FIG. 17(B) is a schematic circuit diagram illustrating the configuration of a pixel unit. FIG. 17(C) is a schematic diagram illustrating the contents of calculation.

In FIGS. 17(A) and 17(B), there are shown photosensing elements 4001, line memories 4003, 4005, 4007 and 4009, correlation calculation units 4004 and 4008, a calculation-result output unit 4010, capacitors 4011 and 4012 for connecting an optical-signal output terminal to output bus lines 4006 and 4002, respectively, a bipolar transistor 4013, a capacitor 4014 connected to the base region of the bipolar transistor 4013, and a switching transistor 4015. Image data incident upon an image-data sensing unit 4020 is subjected to photoelectric conversion by the base region of the bipolar transistor 4103.

An output corresponding to photocarriers subjected to photoelectric conversion is taken out from the emitter of the bipolar transistor 4013 to provide the potential of the corresponding output bus lines via the capacitors 4011 and 4012. According to the above-described operation, the result of addition of pixels in the vertical direction is stored in the line memory 4007, and the result of addition of pixels in the horizontal direction is stored in the line memory 4003. Thus, the results of addition in the x direction and in the y direction of the regions of the pixel elements 4001 to raise the base potential of the bipolar transistor via the capacitor 4014 can be output.

For example, as shown in FIG. 17(C), if images 4016 and 4017 are input at times t1 and t2, respectively, the results of output of addition in the y direction as indicated by reference numerals 4018 and 4019 are obtained and are stored in the line memories 4007 and 4009 shown in FIG. 17(A), respectively. As can be understood from the results 4018 and 4019, the data of the two images shift from each other in accordance with the movement of the images. By calculating the amount of the shift by the correlation calculation unit 4008, the movement of an object on a two-dimensional plane can he detected according to a very simple method.

Each of the correlation calculation circuits 4004 and 4008 can be formed with a smaller number of elements than conventional circuits, and can be arranged at the sensor image pitch. Although the above-described corrrelation calculation is performed using analog signals of the sensor, digital correlation calculation can, of course, be performed by providing an A/D conversion circuit between each memory unit and the bus line. Although, in the ninth embodiment, bipolar transistors are used for the sensor, MOS transistors may also be used. Alternatively, a configuration in which only photodiodes are used without providing transistors for amplification may also be adopted.

In the above-described configuration, correlation calculation between data strings at different times is peformed. By storing results of projection in the x direction and in the y direction of a plurality of pattern data to be recognized in one of the memory units, pattern recognition can also be realized.

As described above, by combining a pixel input unit with the present invention, the following features can be obtained:

(1) By performing parallel processing of data read in parallel at a time instead of performing processing after serially reading data from a conventional sensor, high-speed movement detection and pattern recognition processing can be realized.

(2) Since image processing can be realized using a single-chip sensor without increasing the scale of peripheral circuitry, the following high-performance products can be realized with a low cost: products for controlling the movement of a TV picture surface toward the user, products for controlling the movement of the wind direction of an air conditioner toward the user, products for controlling tracking of an 8-mm camcorder, products for recognizing labels in factories, reception robots for automatically recognizing a person, intervehicle-distance control apparatuses, and the like.

Although a description has been provided of combination of an image input unit with the present invention, the present embodiment is, of course, effective not only for image data but also for voice recogntion processing.

Tenth Embodiment

Figure 18:
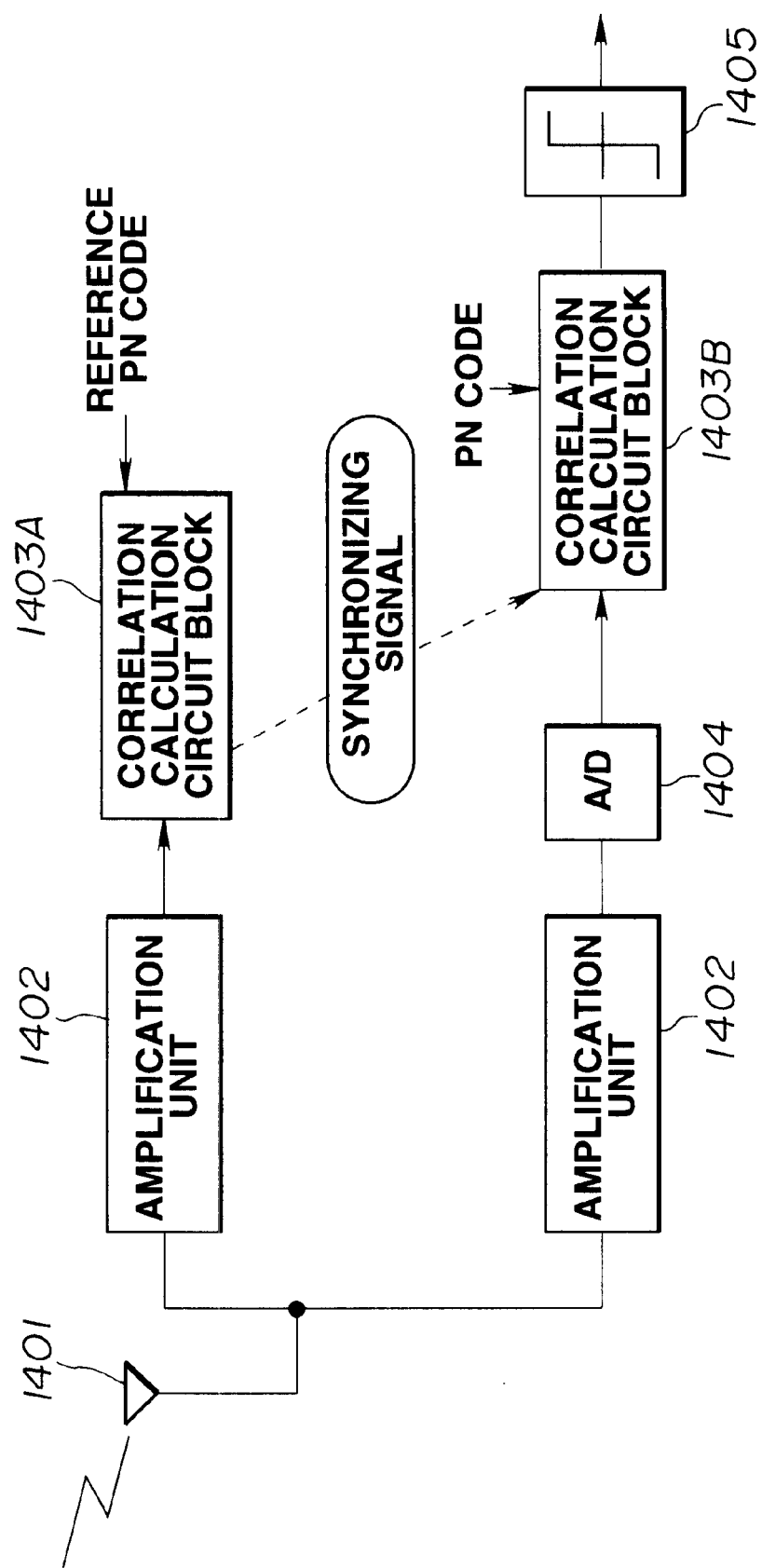
FIG. 18 is a block diagram illustrating circuitry according to a tenth embodiment of the present invention.

FIG. 18 illustrates a tenth embodiment of the present invention. In the tenth embodiment, a correlation calculation circuit unit of the present invention is applied to a reception circuit of spread spectrum communication (SS communication). In FIG. 18, there are shown a reception antenna 1401, a signal demodulation unit 1406, signal amplification units 1402, correlation calculation circuit blocks 1403A and 1403B, an A/D conversion circuit 1404, and a determinator 1405.

In SS communication, a signal is converted into a multibit code called a PN (pseudorandom noise) code, and the PN code is transmitted. The reception side compares PN codes, which have been held in advance, with the received code, detects a state of highest correlation, and demodulates the transmitted signal.

In FIG. 18, a signal received by the antenna 1401 is first subjected to primary demodulation by the demodulation unit 1406, and is then input to the correlation calculation circuit block 1403A, and to the correlation calculation circuit block 1403B after being converted into a digital signal by the A/D conversion circuit 1404. The signal input to the correlation calculation circuit block 1403A is compared with PN codes which have been held in advance by the reception side. The correlation calculation circuit block 1403A forms a synchronizing signal from correlation between the two signals. The correlation calculation circuit block 1403B detects correlation between the output of the A/D conversion circuit 1404 and PN codes in synchronization with the synchronizing signal, and calculates a correlation score. The signal is demodulated by the determinator 1405 based on the correlation score output from the correlation calculalion circuit block 1403B.

Although SS communication has the features of having a high capability of keeping secrecy in conversation, and resistance against noise because a signal is transmitted by being converted into a multibit code, it has the problem of increasing the load of signal processing because the amount of transmitted information increases. However, by using the correlation calculation circuit blocks of the present invention, the same processing can be performed at a high speed with a simple circuit configuration. According to the present embodiment, the SS communication technique can be applied to radio communication of portable information apparatuses.

Eleventh Embodiment

Figure 19:
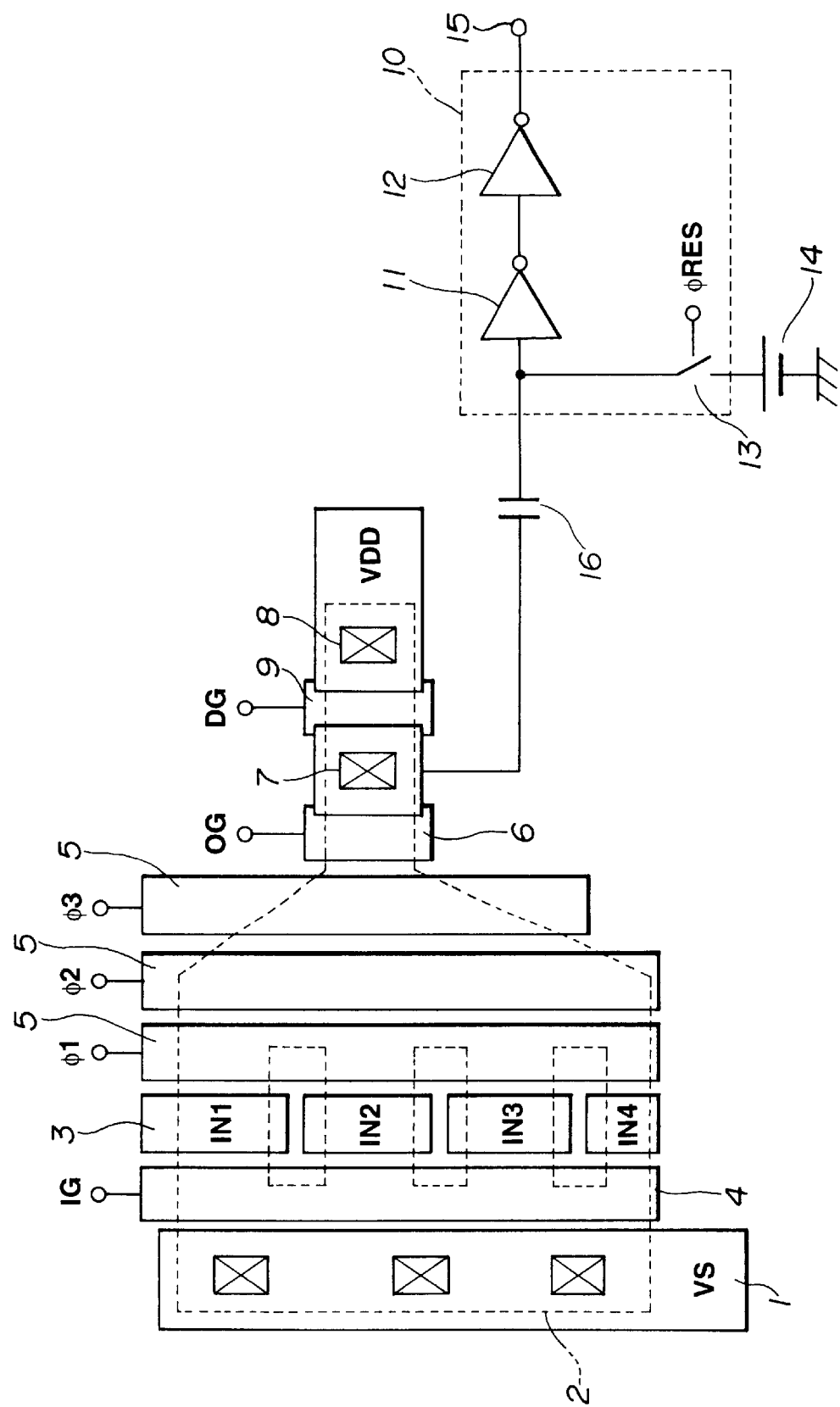
FIG. 19 is a schematic plan view illustrating the configuration of a semiconductor device according to an eleventh embodiment of the present invention.

FIG. 19 illustrates an eleventh embodiment of the present invention. In the eleventh embodiment, electric charges stored under respective gate electrodes 3 are not synthesized at a time, but are synthesized stepwise. In the configuration of the eleventh embodiment, the length of the insulating oxide film under the gate electrodes 3 between inputs IN2 and IN3 is greater than the lengths of the insulating oxide films at other portions.

As shown in FIG. 19, signal charges stored under the gate electrodes 3 driven by the input signals IN1–IN4 are transferred by a pulse $\phi 1$ to a portion under the transfer gate electrode driven by the pulse $\phi 1$, where signal charges stored under the gate electrodes 3 driven by the IN1 and IN3, and IN3 and IN4 are synthesized. The electric charges are then transferred by a pulse $\phi 2$ to a portion under the transfer gate electrode driven by the pulse $\phi 2$, where the electric charges are synthesized and are transferred to a detection unit. According to the configuration of the eleventh embodiment, it is possible to reduce the number of electric charges remaining after transfer, and to perform more precise calculation.

Twelfth Embodiment

Figure 20:
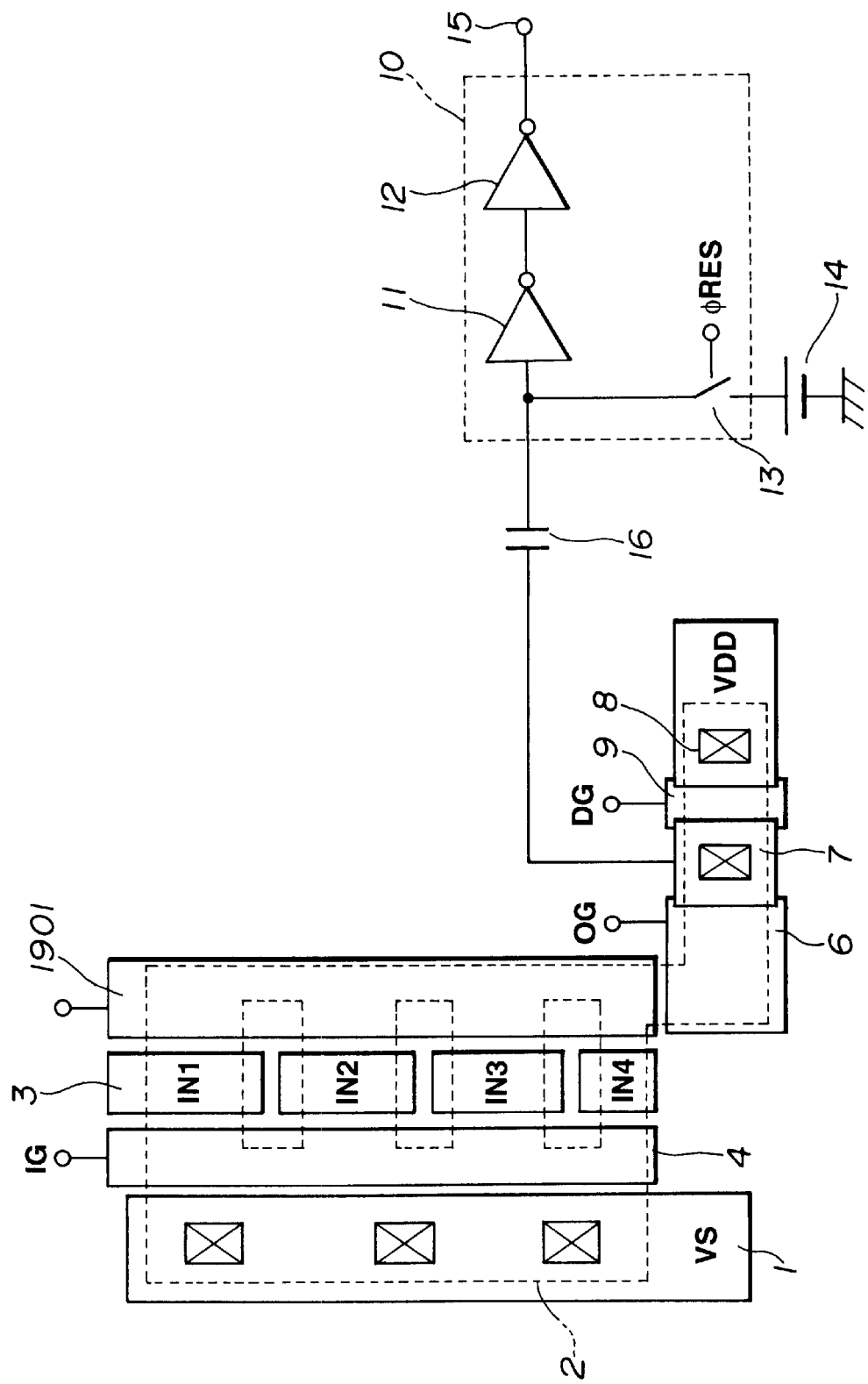
FIG. 20 is a schematic plan view illustrating the configuration of a semiconductor device according to a twelfth embodiment of the present invention.

FIG. 20 illustrates a twelfth embodiment of the present invention. In the twelfth embodiment, a resistive transfer gate is used for synthesizing electric charges stored under respective gate electrodes 3. In FIG. 20, reference numeral 1901 represents a resistive transfer gate. A pulse is applied from one end RG (from the upper end in FIG. 20) of the transfer gate 1901, and is gradually transferred to the opposite side (to the lower side in FIG. 20) by a CR time constant possessed by the transfer gate 1901 itself. Electric charges stored under each of the gate electrodes 3 are transferred in synchronization with propagation of the pulse to the region under the transfer gate 1901 facing that gate. The transferred electric charges are transferred to the opposite side (to the lower side in FIG. 20) under the transfer gate 1901 in accordance with the propagation of the pulse. Then, as in the first embodiment, the electric charges stored under the FD unit 7 is output to a sense amplifier 10 via an output gate. At that time, a source-follower amplifier may be included. By thus using the resistive transfer gate 1901, electric charges can be synthesized and transferred without using complicated pulses, such as the pulses $\phi 1$–$\phi 3$ in the first embodiment.

As described above, according to the present invention, by configuring a circuit and a system for performing parallel calculation processing by providing a charge transfer channel to one end of which electric charges supplied from charge supply means are input and which includes a plurality of branching regions at an intermediate portion, a plurality of gate electrodes provided on the corresponding branching regions of the charge transfer channel via insulating films, input-signal supply means for supplying each of the gate electrodes with an input signal, a transfer electrode, provided on the charge transfer channel via a gate insulating film, for performing control so that the electric charges are transferred in a predetermined direction within the charge transfer channel, conversion means for converting the transferred electric charges into a voltage, and sense amplifier means to which an output signal from the conversion means is input, it is possible to perform calculation processing, such as majority determination or the like, by a configuration using simple manufacturing processes, and to reduce the scale of circuitry, increase the calculation speed, improve accuracy in calculation, and reduce electric power consumption.

The individual components shown in outline or designated by blocks in the drawings are all well known in the semiconductor device and semiconductor circuit arts and their specific construction and operation are not critical to the operation or the best mode for carrying out the invention.

While the present invention has been described with respect to what are presently considered to be the preferred embodiments, it is to be understood that invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A majority calculation semiconductor device comprising:
    a charge transfer channel to one end of which electric charges supplied from a charge supply unit are input, and which includes a plurality of branching regions at an intermediate portion;
    an insulated reset gate electrode provided on one of said branching regions;
    independent insulated gate electrodes, each independent insulated gate electrode being provided on the corresponding one of the other branching regions;
    an insulated transfer electrode, provided on a common region of said charge transfer channel, for transferring the electric charges in a predetermined direction within said charge transfer channel;
    a conversion unit adapted to convert the transferred electric charges into a voltage which corresponds to the combined charges; and
    a resettable sense amplifier unit to which an output signal from said conversion unit is input and which produces outputs corresponding to said voltage following each resetting thereof; and
    wherein input signals are input to said independent insulated gate electrodes so that the charges corresponding to said input signals are transferred to said common region.

2. A semiconductor device comprising:
    a charge transfer channel to one end of which electric charges supplied from charge supply means are input, and which includes a plurality of branching regions at an intermediate portion, said charge transfer channel including means for inputting said electric charges to each of said branching regions in the same intervals;
    a plurality of gate electrodes provided on the corresponding branching regions of said charge transfer channel via insulating films;
    an input signal supply circuit connected to supply different signals to different ones of said gate electrodes during a given interval so that the charge in each channel corresponds to a respective one of said different signals;
    a transfer electrode, provided on said charge transfer channel via a gate insulating film, for performing control so that the electric charges are transferred in a predetermined direction within said charge transfer channel;
    conversion means for converting the transferred electric charges into a voltage which corresponds to the combined charges; and
    resettable sense amplifier means to which an output signal from said conversion means is input and which produces outputs corresponding to said voltage following each resetting thereof,
    the total amount of gate capacitance values of said gate electrodes corresponding to said input-supply means being substantially an odd multiple of a minimum capacitance value C of the gate capacitance of the respective gate electrodes.

3. A majority calculation semiconductor device comprising:
    a charge transfer channel to one end of which electric charges supplied from charge supply unit are input, and which includes a plurality of branching regions at an intermediate portion,
    an insulated reset gate electrode provided on one of said branching regions;
    an odd number of independent insulated gate electrodes, each being provided on the corresponding one of the other branching regions;
    an insulated transfer electrode, provided on a common region of said charge transfer channel, for transferring the electric charges in a predetermined direction within said charge transfer channel;
    a conversion unit adapted to convert the transferred electric charges into a voltage which corresponds to the combined charges; and
    a resettable sense amplifier unit to which an output signal from said conversion unit is input and which produces outputs corresponding to said voltage following each resetting thereof, wherein input signals are input to said independent insulated gate electrodes so that the charges corresponding to said input signals are transferred to said common region.

4. A majority calculation semiconductor device according to claim 3, further comprising:
    an electrode to which a reset-signal is supplied by a reset-signal supply unit for supplying a reset signal, in addition to the odd number of gate electrodes at said branching regions to which said input signal is supplied.

5. A semiconductor circuit which includes a plurality of semiconductor devices, each comprising:
    a charge transfer channel to one end of which electric charges supplied from charge supply means are input, and which includes a plurality of branching regions at an intermediate portion;
    a plurality of gate electrodes provided on the corresponding branching regions of said charge transfer channel via insulating films;
    input-signal supply means for supplying each of said gate electrodes with an input signal;
    a transfer electrode, provided on said charge transfer channel via a gate insulating film, for performing control so that the electric charges are transferred in a predetermined direction within said charge transfer channel;
    conversion means for converting the transferred electric charges into a voltage which corresponds to the combined charges; and
    resettable sense amplifier means to which an output signal from said conversion means is input and which produces outputs corresponding to said voltage following each resetting thereof.

6. A semiconductor circuit which includes a semiconductor device comprising:
- a charge transfer channel to one end of which electric charges supplied from charge supply means are input, and which includes a plurality of branching regions at an intermediate portion, said charge transfer channel including means for inputting said electric charges to each of said branching regions in the same intervals;
- a plurality of gate electrodes provided on the corresponding branching regions of said charge transfer channel via insulating films;
- an input signal supply circuit connected to supply different signals to different ones of said gate electrodes during a given interval so that the charge in each channel corresponds to a respective one of said different signals;
- a transfer electrode, provided on said charge transfer channel via a gate insulating film, for performing control so that the electric charges are transferred in a predetermined direction within said charge transfer channel;
- conversion means for converting the transferred electric charges into a voltage which corresponds to the combined charges;
- resettable sense amplifier means to which an output signal from said conversion means is input and which produces outputs corresponding to said voltage following each resetting thereof; and
- a circuit for performing correlation calculation.

7. A semiconductor circuit according to claim 6, further comprising a correlation calculation circuit used in a signal processing system.

8. A semiconductor circuit according to claim 7, wherein the signal processing system includes an image-signal input device for inputting an image signal.

9. A semiconductor device comprising:
- a charge transfer channel to which electric charges are supplied from charge supply means, and which includes a plurality of branching regions, said charge transfer channel including means for inputting said electric charges to each of said branching regions in the same intervals;
- a plurality of gate electrodes provided on the corresponding branching regions via insulating films;
- an input signal supply circuit connected to supply different signals to different ones of said gate electrodes during a given interval so that the charge in each channel corresponds to a respective one of said different signals;
- a transfer electrode, adjacent to said gate electrodes, for transferring the electric charges in a predetermined direction within said charge transfer channel;
- conversion means for converting the transferred electric charges into a voltage which corresponds to the combined charges;
- resettable sense amplifier means to which an output signal from said conversion means is input and which produces outputs corresponding to said voltage following each resetting thereof; and
- a floating gate via which a signal transferred from said transfer electrode is input to said conversion means, said floating gate comprising a plurality of floating gates.

10. A semiconductor circuit which includes a plurality of semiconductor devices, each of said semiconductor devices comprising:
- a charge transfer channel to which electric charges are supplied from charge supply means, and which includes a plurality of branching regions;
- a plurality of gate electrodes provided on the corresponding branching regions via insulating films;
- input-signal supply means for supplying each of said gate electrodes with an input signal;
- a transfer electrode, adjacent to said gate electrodes, for transferring electric charges in a predetermined direction within said charge transfer channel; and
- conversion means for converting the electric charges transferred by said transfer electrode into a voltage, wherein an output of a first semiconductor device from among the plurality of semiconductor devices and/or an inverted output of the output of the first semiconductor device are/is input to a second semiconductor device from among the plurality of semiconductor devices.

* * * * *